(12) United States Patent
Noyes et al.

(10) Patent No.: US 8,938,590 B2
(45) Date of Patent: *Jan. 20, 2015

(54) INDIRECT REGISTER ACCESS METHOD AND SYSTEM

(75) Inventors: Harold B Noyes, Boise, ID (US); Mark Jurenka, Boise, ID (US); Gavin Huggins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1201 days.

This patent is subject to a terminal disclaimer.

(21) Appl. No.: 12/253,967

(22) Filed: Oct. 18, 2008

(65) Prior Publication Data

US 2010/0100691 A1    Apr. 22, 2010

(51) Int. Cl.
| G06F 12/00 | (2006.01) |
| G06F 13/00 | (2006.01) |
| G06F 13/28 | (2006.01) |
| G06F 9/30  | (2006.01) |
| G06F 9/34  | (2006.01) |

(52) U.S. Cl.
CPC .......... G06F 9/3012 (2013.01); G06F 9/30138 (2013.01); G06F 9/34 (2013.01)
USPC .................... 711/154; 711/203; 711/E12.001

(58) Field of Classification Search
CPC ... G06F 13/385; G06F 2207/025; G06F 7/02; G06F 13/28; G06F 13/38; G06F 13/4004; G06F 13/4018; G06F 17/30976; G06F 9/3012; G06F 9/30138; G06F 9/34
USPC .................................. 711/154, 203, E12.001
See application file for complete search history.

(56) References Cited

U.S. PATENT DOCUMENTS

| 3,849,760 A | * | 11/1974 | Endou et al. .................. 382/205 |
| 3,946,366 A | * | 3/1976  | Edwards, Jr. ................. 711/211 |
| 5,300,830 A |   | 4/1994  | Hawes |
| 5,331,227 A |   | 7/1994  | Hawes |
| 5,713,038 A | * | 1/1998  | Motomura ....................... 712/41 |
| 5,890,222 A | * | 3/1999  | Agarwal et al. ............... 711/220 |
| 6,052,766 A | * | 4/2000  | Betker et al. .................. 711/200 |

(Continued)

FOREIGN PATENT DOCUMENTS

| FR | 2775089  | 8/1999  |
| WO | 95/32466 | 11/1995 |

OTHER PUBLICATIONS

U.S. Appl. No. 60/652,738, filed Feb. 12, 2005, Harris et al.

(Continued)

*Primary Examiner* — Sheng-Jen Tsai
(74) *Attorney, Agent, or Firm* — Fletcher Yoder PC

(57) ABSTRACT

Systems and methods are provided for managing access to registers. In one embodiment, a system may include a processor and a plurality of registers. The processor and the plurality of registers may be integrated into a single device, or may be in separate devices. The plurality of registers may include a first set of registers that are directly accessible by the processor, and a second set of registers that are not directly accessible by the processor. The second set of registers may, however, be accessed indirectly by the processor via the first set of registers. In one embodiment, the first set of registers may include a register for selecting a register bank from the second set of registers, and a register for selecting a particular address within the register bank, to allow indirect access by the processor to the registers of the second set.

10 Claims, 15 Drawing Sheets

(56) References Cited

U.S. PATENT DOCUMENTS

| | | | |
|---|---|---|---|
| 6,192,463 B1* | 2/2001 | Mitra et al. | 712/43 |
| 6,240,003 B1 | 5/2001 | McElroy | |
| 6,735,664 B1 | 5/2004 | Keller | |
| 6,880,087 B1 | 4/2005 | Carter | |
| 6,906,938 B2 | 6/2005 | Kaginele | |
| 6,944,710 B2 | 9/2005 | Regev et al. | |
| 7,089,352 B2 | 8/2006 | Regev et al. | |
| 7,146,643 B2 | 12/2006 | Dapp et al. | |
| 7,392,229 B2 | 6/2008 | Harris et al. | |
| 7,487,131 B2 | 2/2009 | Harris et al. | |
| 7,487,542 B2* | 2/2009 | Boulanger et al. | 726/23 |
| 7,774,286 B1 | 8/2010 | Harris | |
| 7,774,661 B2* | 8/2010 | Jiang et al. | 714/718 |
| 8,065,249 B1 | 11/2011 | Harris | |
| 8,140,780 B2* | 3/2012 | Noyes | 711/156 |
| 8,209,521 B2* | 6/2012 | Noyes et al. | 712/220 |
| 8,688,877 B1* | 4/2014 | Lee et al. | 710/71 |
| 8,725,961 B2* | 5/2014 | Noyes | 711/156 |
| 2005/0259777 A1* | 11/2005 | Claseman | 377/64 |
| 2007/0075878 A1 | 4/2007 | Furodet et al. | |
| 2007/0127482 A1 | 6/2007 | Harris et al. | |
| 2007/0282833 A1 | 12/2007 | McMillen et al. | |
| 2008/0046697 A1* | 2/2008 | Sugure et al. | 712/218 |
| 2008/0133874 A1* | 6/2008 | Capek et al. | 711/206 |
| 2011/0307433 A1 | 12/2011 | Dlugosch | |
| 2011/0307503 A1 | 12/2011 | Dlugosch | |
| 2012/0192163 A1 | 7/2012 | Glendenning | |
| 2012/0192164 A1 | 7/2012 | Xu | |
| 2012/0192165 A1 | 7/2012 | Xu | |
| 2012/0192166 A1 | 7/2012 | Xu | |

OTHER PUBLICATIONS

U.S. Appl. No. 12/253,966, filed Oct. 18, 2008, Noyes.
U.S. Appl. No. 12/265,421, filed Nov. 5, 2008, Noyes.
U.S. Appl. No. 12/265,436, filed Nov. 5, 2008, Noyes et al.
U.S. Appl. No. 12/265,465, filed Nov. 5, 2008, Noyes.
U.S. Appl. No. 12/268,270, filed Nov. 10, 2008, Noyes et al.
U.S. Appl. No. 12/325,875, filed Dec. 1, 2008, Noyes.
U.S. Appl. No. 12/325,982, filed Dec. 1, 2008, Noyes.
U.S. Appl. No. 12/325,986, filed Dec. 1, 2008, Noyes.
U.S. Appl. No. 12/325,990, filed Dec. 1, 2008, Noyes.
U.S. Appl. No. 12/347,403, filed Dec. 31, 2008, Noyes.
U.S. Appl. No. 12/350,132, filed Jan. 7, 2009, Pawlowski.
U.S. Appl. No. 12/350,136, filed Jan. 7, 2009, Pawlowski.
U.S. Appl. No. 12/350,142, filed Jan. 7, 2009, Pawlowski.
U.S. Appl. No. 12/352,311, filed Jan. 12, 2009, Noyes.
Beesley, K. R.; Arabic Morphology Using Only Finite-State Operations; Xerox Research Centre Europe; pp. 50-57.
Bird, S. et al.; One-Level Phonology: Autosegmental Representations and Rules as Finite Automata; Association for Computational Linguistics; University of Edinburgh; vol. 20; No. 1; pp. 55-90; 1994.
Bispo, J. et al.; Regular Expression Matching for Reconfigurable Packet Inspection; IEEE.
Bispo, J. et al.; Synthesis of Regular Expressions Targeting FPGAs: Current Status and Open Issues; IST/INESC-ID, Libson, Portugal; pp. 1-12.
Brodie, B. et al.; A scalable Architecture for High-Throughput Regular-Expression Pattern Matching; Exegy Inc.; pp. 1-12.
Clark, C.; Design of Efficient FPGA Circuits for Matching Complex Patterns in Network Intrusion Detection Systems (Master of Science Thesis); Georgia Institute of Technology; pp. 1-56; Dec. 2003.
Clark, C.; A Unified Model of Pattern-Matching Circuits for Field-Programmable Gate Arrays [Doctoral Dissertation]; Georgia Institute of Technology; pp. 1-177; 2006.
Clark, C. et al.; Scalable Pattern Matching for High Speed Networks; Proceedings of the 12th Annual IEEE symposium on Field-Programmable Custom Computing Machines (FCCM'04);Georgia Institute of Technology; pp. 1-9; 2004.
Clark, C. et al.; A Unified Model of Pattern-Matching Circuit Architectures; Tech Report GIT-CERCS-05-20;Georgia Institute of Technology; pp. 1-17.
Fide, S.; String Processing in Hardware; Scalable Parallel and Distributed Systems Lab; Proceedings of the 12th Annual IEEE symposium on Field-Programmable Custom Computing Machines (FCCM'04);School of Electrical and Computer Engineering; Georgia Institute of Technology; pp. 1-9; 2004.
Fisk, M. et al.; Applying Fast String Matching to Intrusion Detection; Los Alamos National Laboratory; University of California San Diego; pp. 1-21.
Korenek, J.; Traffic Scanner-Hardware Accelerated Intrusion Detection System; http://www.liberouter.org/ ;2006.
Kumar, S. et al.; Curing Regular Expressions matching Algorithms from Insomnia, Amnesia, and Acaluia; Department of Computer Science and Engineering; Washington University in St. Louis; pp. 1-17; Apr. 27, 2007.
Lipovski, G.; Dynamic Systolic Associative Memory Chip; IEEE; Department of Electrical and Computer Engineering; University of Texas at Austin; pp. 481-492; 1990.
Lin, C. et al.; Optimization of Pattern Matching Circuits for Regular Expression on FPGA; IEEE Transactions on Very Large Scale Integrations Systems; vol. 15, No. 12, pp. 1-6; Dec. 2007.
Schultz, K. et al.; Fully Parallel Integrated CAM/RAM Using Preclassification to Enable Large Capacities; IEEE Journal on Solid-State Circuits; vol. 31; No. 5; pp. 689-699; May 1996.
Shafai, F. et al.; Fully Parallel 30-MHz, 2.5-Mb CAM; IEEE Journal of Solid-State Circuits, vol. 33; No. 11; pp. 1690-1696; Nov. 1998.
Sidhu, R. et al.; Fast Regular Expression Pattern Matching using FPGAs; Department of EE-Systems; University of Southern California; pp. 1-12.
Wada, T.; Multiobject Behavior Recognition Event Driven Selective Attention Method; IEEE; pp. 1-16; 2000.
Yu, F.; High Speed Deep Packet Inspection with Hardware Support; Electrical Engineering and Computer Sciences; University of California at Berkeley; pp. 1-217; Nov. 22, 2006.
Freescale and Kaspersky® Accelerated Antivirus Solution Platform for OEM Vendors; Freescale Semiconductors Document; pp. 1-16; 2007.
Hurson A. R.; A VLSI Design for the Parallel Finite State Automaton and Its Performance Evaluation as a Hardware Scanner; International Journal of Computer and Information Sciences, vol. 13, No. 6. 1984.

* cited by examiner

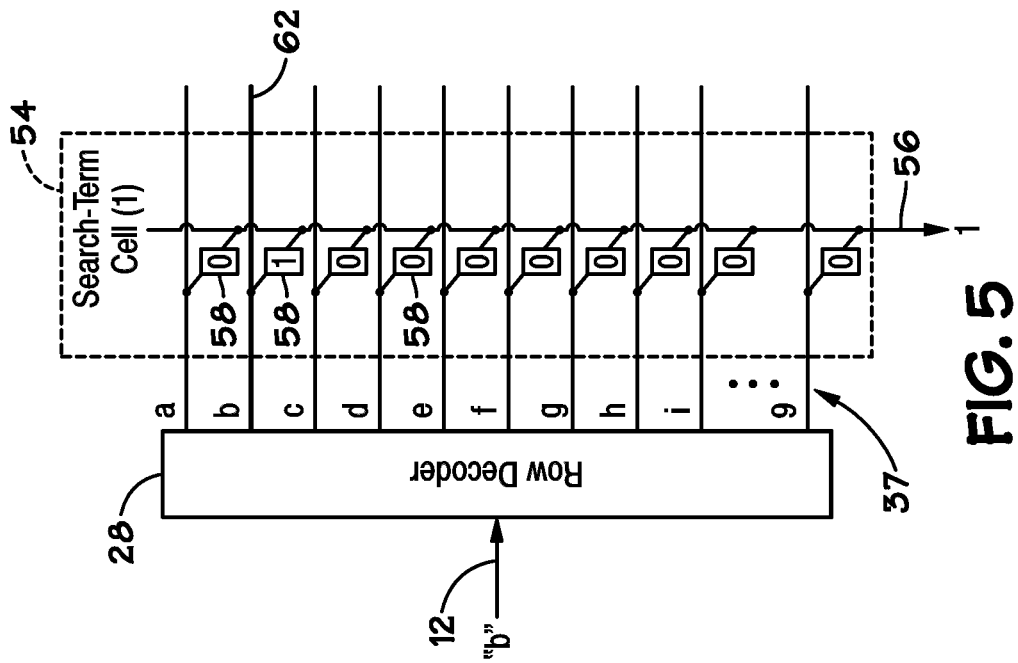
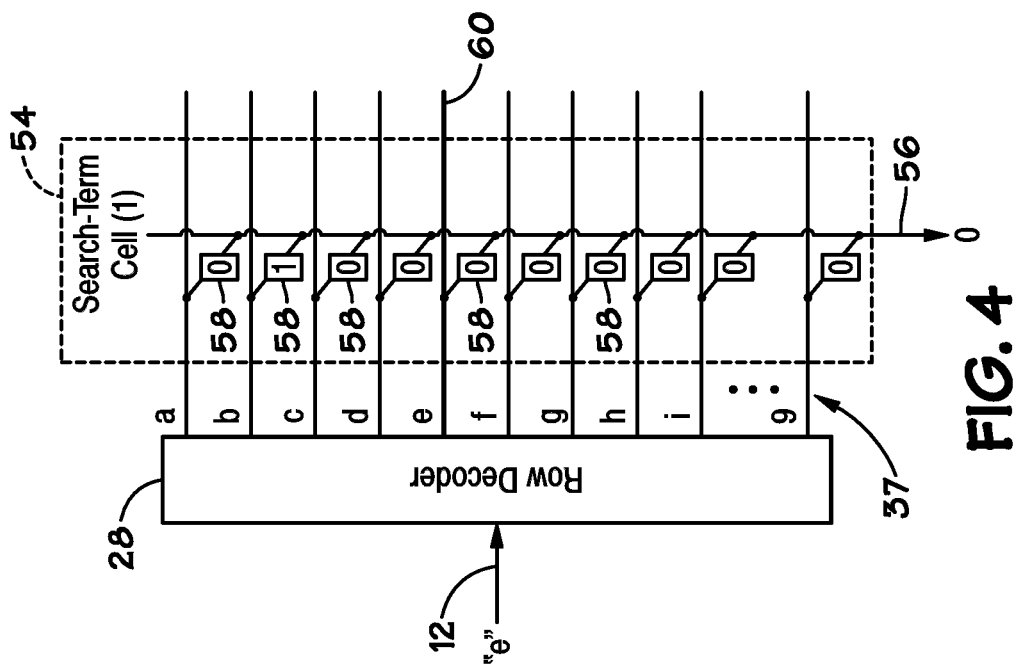

US 8,938,590 B2

INDIRECT REGISTER ACCESS METHOD AND SYSTEM

BACKGROUND

1. Field of Invention

Embodiments of the invention relate generally to digital data processing, and, more specifically, in certain embodiments, to providing and managing registers.

2. Description of Related Art

In the field of computing, pattern recognition tasks are increasingly challenging. Ever larger volumes of data are transmitted between computers, and the number of patterns that users wish to identify is increasing. For example, spam or malware are often detected by searching for patterns in a data stream, e.g., particular phrases or pieces of code. The number of patterns increases with the variety of spam and malware, as new patterns may be implemented to search for new variants. Searching a data stream for each of these patterns can form a computing bottleneck. Often, as the data stream is received, it is searched for each pattern, one at a time. The delay before the system is ready to search the next portion of the data stream increases with the number of patterns. Thus, pattern recognition may slow the receipt of data.

Additionally, systems that perform the pattern recognition and the other associated processing may use multiple registers to store various data, such as search data, configuration parameters, status information, pattern-matching results, or the like. These "processor registers" may typically be directly available to a processing unit of the system, for example, in order to provide quick access as compared to other storage that may be accessible to the processing unit. It may be appreciated, however, that many systems include a finite addressing space for recording the physical location of various forms of memory, including main system memory (e.g., random access memory) as well as such registers. Further, certain systems, such as pattern-recognition systems, may include a large number of registers to enable configuration and operation of the system. If a system includes a large number of registers accessible by the processing unit, the remaining address space available for main system memory may be reduced and overall performance of the system may be impacted.

BRIEF DESCRIPTION OF THE DRAWINGS

FIGS. 4 and 5 depict the search-term cell of FIG. 3 searching the data stream for a single character;

DETAILED DESCRIPTION OF SPECIFIC EMBODIMENTS

Figure 1:
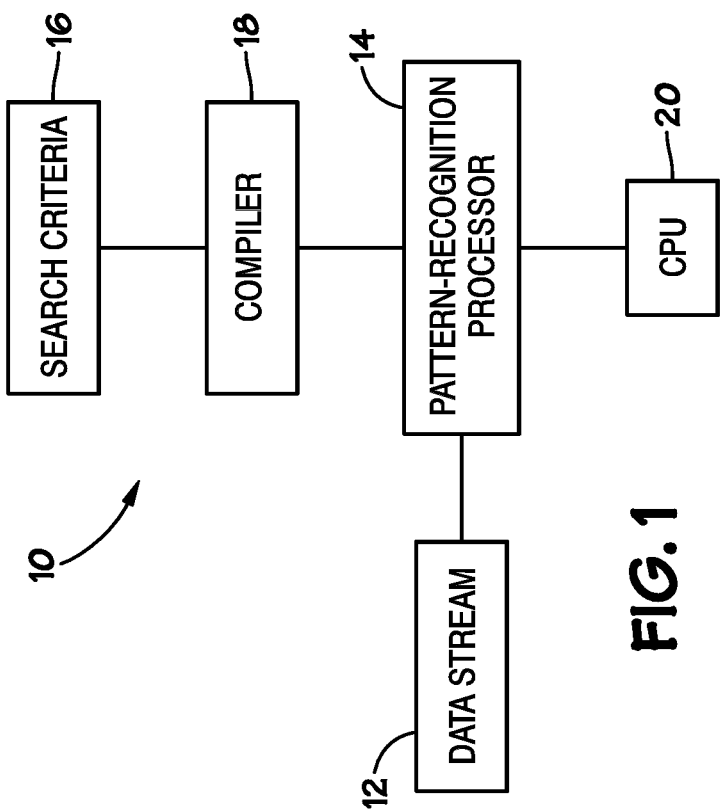
FIG. 1 depicts an example of system that searches a data stream.

FIG. 1 depicts an example of a system 10 that searches a data stream 12. The system 10 may include a pattern-recognition processor 14 that searches the data stream 12 according to search criteria 16.

Each search criterion may specify one or more target expressions, i.e., patterns. The phrase "target expression" refers to a sequence of data for which the pattern-recognition processor 14 is searching. Examples of target expressions include a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase.

A search criterion may specify more than one target expression. For example, a search criterion may specify all five-letter words beginning with the sequence of letters "cl", any word beginning with the sequence of letters "cl", a paragraph that includes the word "cloud" more than three times, etc. The number of possible sets of target expressions is arbitrarily large, e.g., there may be as many target expressions as there are permutations of data that the data stream could present. The search criteria may be expressed in a variety of formats, including as regular expressions, a programming language that concisely specifies sets of target expressions without necessarily listing each target expression.

Each search criterion may be constructed from one or more search terms. Thus, each target expression of a search criterion may include one or more search terms and some target expressions may use common search terms. As used herein, the phrase "search term" refers to a sequence of data that is searched for, during a single search cycle. The sequence of data may include multiple bits of data in a binary format or other formats, e.g., base ten, ASCII, etc. The sequence may encode the data with a single digit or multiple digits, e.g., several binary digits. For example, the pattern-recognition processor 14 may search a text data stream 12 one character at a time, and the search terms may specify a set of single characters, e.g., the letter "a", either the letters "a" or "e", or a wildcard search term that specifies a set of all single characters.

Search terms may be smaller or larger than the number of bits that specify a character (or other grapheme—i.e., fundamental unit—of the information expressed by the data stream, e.g., a musical note, a genetic base pair, a base-10 digit, or a sub-pixel). For instance, a search term may be 8 bits and a single character may be 16 bits, in which case two consecutive search terms may specify a single character.

The search criteria 16 may be formatted for the pattern-recognition processor 14 by a compiler 18. Formatting may include deconstructing search terms from the search criteria. For example, if the graphemes expressed by the data stream 12 are larger than the search terms, the compiler may deconstruct the search criterion into multiple search terms to search for a single grapheme. Similarly, if the graphemes expressed by the data stream 12 are smaller than the search terms, the compiler 18 may provide a single search term, with unused bits, for each separate grapheme. The compiler 18 may also format the search criteria 16 to support various regular expressions operators that are not natively supported by the pattern-recognition processor 14.

The pattern-recognition processor 14 may search the data stream 12 by evaluating each new term from the data stream 12. The word "term" here refers to the amount of data that could match a search term. During a search cycle, the pattern-recognition processor 14 may determine whether the currently presented term matches the current search term in the search criterion. If the term matches the search term, the evaluation is "advanced", i.e., the next term is compared to the next search term in the search criterion. If the term does not match, the next term is compared to the first term in the search criterion, thereby resetting the search.

Each search criterion may be compiled into a different finite state machine in the pattern-recognition processor 14. The finite state machines may run in parallel, searching the data stream 12 according to the search criteria 16. The finite state machines may step through each successive search term in a search criterion as the preceding search term is matched by the data stream 12, or if the search term is unmatched, the finite state machines may begin searching for the first search term of the search criterion.

The pattern-recognition processor 14 may evaluate each new term according to several search criteria, and their respective search terms, at about the same time, e.g., during a single device cycle. The parallel finite state machines may each receive the term from the data stream 12 at about the same time, and each of the parallel finite state machines may determine whether the term advances the parallel finite state machine to the next search term in its search criterion. The parallel finite state machines may evaluate terms according to a relatively large number of search criteria, e.g., more than 100, more than 1000, or more than 10,000. Because they operate in parallel, they may apply the search criteria to a data stream 12 having a relatively high bandwidth, e.g., a data stream 12 of greater than or generally equal to 64 MB per second or 128 MB per second, without slowing the data stream. In some embodiments, the search-cycle duration does not scale with the number of search criteria, so the number of search criteria may have little to no effect on the performance of the pattern-recognition processor 14.

When a search criterion is satisfied (i.e., after advancing to the last search term and matching it), the pattern-recognition processor 14 may report the satisfaction of the criterion to a processing unit, such as a central processing unit (CPU) 20. The central processing unit 20 may control the pattern-recognition processor 14 and other portions of the system 10.

The system 10 may be any of a variety of systems or devices that search a stream of data. For example, the system 10 may be a desktop, laptop, handheld or other type of computer that monitors the data stream 12. The system 10 may also be a network node, such as a router, a server, or a client (e.g., one of the previously-described types of computers). The system 10 may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The data stream 12 may be one or more of a variety of types of data streams that a user or other entity might wish to search. For example, the data stream 12 may be a stream of data received over a network, such as packets received over the Internet or voice or data received over a cellular network. The data stream 12 may be data received from a sensor in communication with the system 10, such as an imaging sensor, a temperature sensor, an accelerometer, or the like, or combinations thereof. The data stream 12 may be received by the system 10 as a serial data stream, in which the data is received in an order that has meaning, such as in a temporally, lexically, or semantically significant order. Alternatively, the data stream 12 may be received in parallel or out of order and, then, converted into a serial data stream, e.g., by reordering packets received over the Internet. In some embodiments, the data stream 12 may present terms serially, but the bits expressing each of the terms may be received in parallel. The data stream 12 may be received from a source external to the system 10, or may be formed by interrogating a memory device and forming the data stream 12 from stored data.

Depending on the type of data in the data stream 12, different types of search criteria may be chosen by a designer. For instance, the search criteria 16 may be a virus definition file. Viruses or other malware may be characterized, and aspects of the malware may be used to form search criteria that indicate whether the data stream 12 is likely delivering malware. The resulting search criteria may be stored on a server, and an operator of a client system may subscribe to a service that downloads the search criteria to the system 10. The search criteria 16 may be periodically updated from the server as different types of malware emerge. The search criteria may also be used to specify undesirable content that might be received over a network, for instance unwanted emails (commonly known as spam) or other content that a user finds objectionable.

The data stream 12 may be searched by a third party with an interest in the data being received by the system 10. For example, the data stream 12 may be monitored for text, a sequence of audio, or a sequence of video that occurs in a copyrighted work. The data stream 12 may be monitored for utterances that are relevant to a criminal investigation or civil proceeding or are of interest to an employer.

The search criteria 16 may also include patterns in the data stream 12 for which a translation is available, e.g., in memory addressable by the CPU 20 or the pattern-recognition processor 14. For instance, the search criteria 16 may each specify an English word for which a corresponding Spanish word is stored in memory. In another example, the search criteria 16 may specify encoded versions of the data stream 12, e.g., MP3, MPEG 4, FLAC, Ogg Vorbis, etc., for which a decoded version of the data stream 12 is available, or vice versa.

The pattern-recognition processor 14 may be hardware that is integrated with the CPU 20 into a single component (such as a single device) or may be formed as a separate component. For instance, the pattern-recognition processor 14 may be a separate integrated circuit. The pattern-recognition processor 14 may be referred to as a "co-processor" or a "pattern-recognition co-processor".

Figure 2:
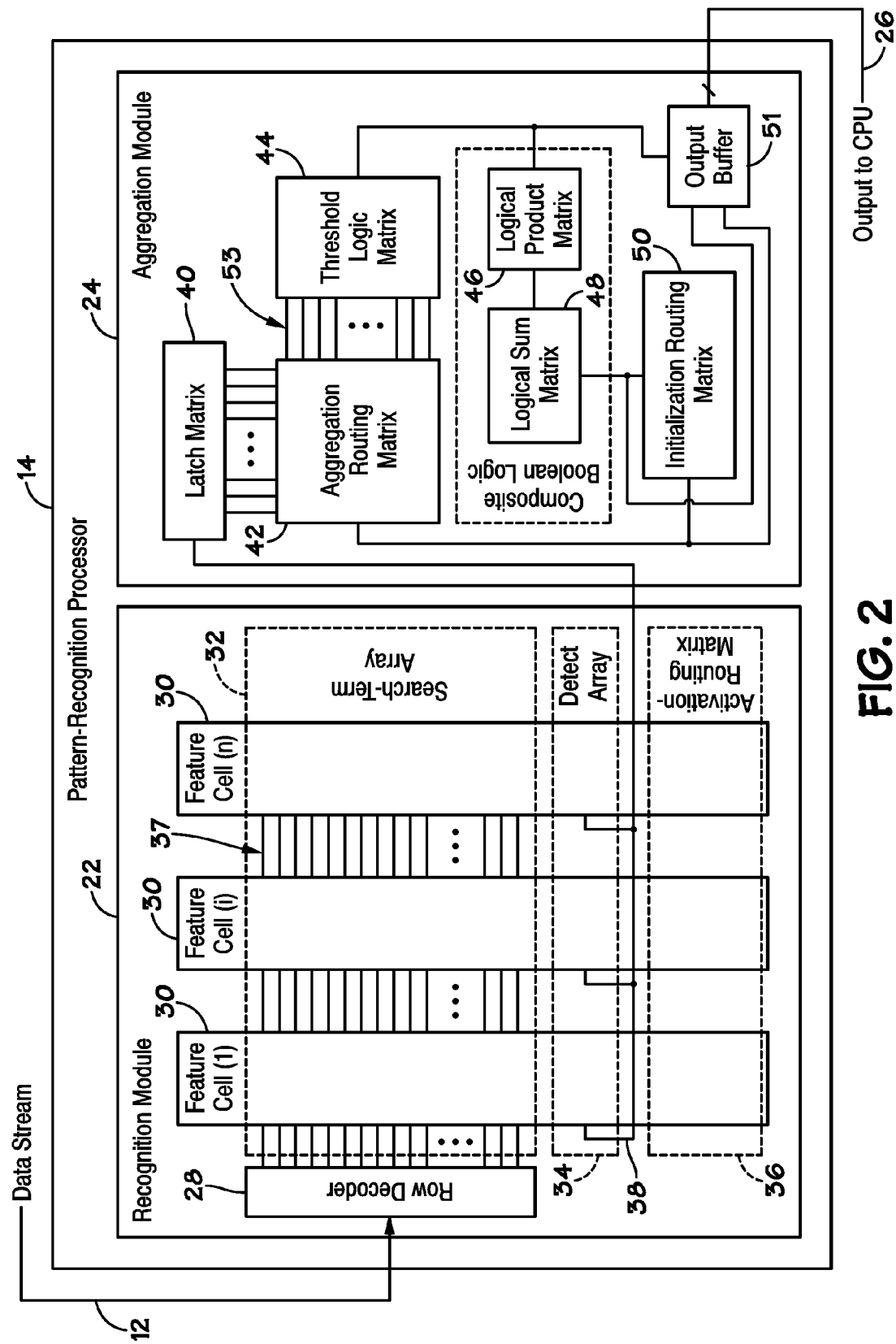
FIG. 2 depicts an example of a pattern-recognition processor in the system of FIG. 1.

FIG. 2 depicts an example of the pattern-recognition processor 14. The pattern-recognition processor 14 may include a recognition module 22 and an aggregation module 24. The recognition module 22 may be configured to compare received terms to search terms, and both the recognition module 22 and the aggregation module 24 may cooperate to determine whether matching a term with a search term satisfies a search criterion.

The recognition module 22 may include a row decoder 28 and a plurality of feature cells 30. Each feature cell 30 may specify a search term, and groups of feature cells 30 may form a parallel finite state machine that forms a search criterion. Components of the feature cells 30 may form a search-term array 32, a detection array 34, and an activation-routing matrix 36. The search-term array 32 may include a plurality of input conductors 37, each of which may place each of the feature cells 30 in communication with the row decoder 28.

The row decoder 28 may select particular conductors among the plurality of input conductors 37 based on the content of the data stream 12. For example, the row decoder 28 may be a one byte to 256 row decoder that activates one of 256 rows based on the value of a received byte, which may represent one term. A one-byte term of 0000 0000 may correspond to the top row among the plurality of input conductors 37, and a one-byte term of 1111 1111 may correspond to the bottom row among the plurality of input conductors 37. Thus, different input conductors 37 may be selected, depending on which terms are received from the data stream 12. As different terms are received, the row decoder 28 may deactivate the row corresponding to the previous term and activate the row corresponding to the new term.

The detection array 34 may couple to a detection bus 38 that outputs signals indicative of complete or partial satisfaction of search criteria to the aggregation module 24. The activation-routing matrix 36 may selectively activate and deactivate feature cells 30 based on the number of search terms in a search criterion that have been matched.

The aggregation module 24 may include a latch matrix 40, an aggregation-routing matrix 42, a threshold-logic matrix 44, a logical-product matrix 46, a logical-sum matrix 48, and an initialization-routing matrix 50.

The latch matrix 40 may implement portions of certain search criteria. Some search criteria, e.g., some regular expressions, count only the first occurrence of a match or group of matches. The latch matrix 40 may include latches that record whether a match has occurred. The latches may be cleared during initialization, and periodically re-initialized during operation, as search criteria are determined to be satisfied or not further satisfiable—i.e., an earlier search term may need to be matched again before the search criterion could be satisfied.

The aggregation-routing matrix 42 may function similar to the activation-routing matrix 36. The aggregation-routing matrix 42 may receive signals indicative of matches on the detection bus 38 and may route the signals to different group-logic lines 53 connecting to the threshold-logic matrix 44. The aggregation-routing matrix 42 may also route outputs of the initialization-routing matrix 50 to the detection array 34 to reset portions of the detection array 34 when a search criterion is determined to be satisfied or not further satisfiable.

The threshold-logic matrix 44 may include a plurality of counters, e.g., 32-bit counters configured to count up or down. The threshold-logic matrix 44 may be loaded with an initial count, and it may count up or down from the count based on matches signaled by the recognition module. For instance, the threshold-logic matrix 44 may count the number of occurrences of a word in some length of text.

The outputs of the threshold-logic matrix 44 may be inputs to the logical-product matrix 46. The logical-product matrix 46 may selectively generate "product" results (e.g., "AND" function in Boolean logic). The logical-product matrix 46 may be implemented as a square matrix, in which the number of output products is equal the number of input lines from the threshold-logic matrix 44, or the logical-product matrix 46 may have a different number of inputs than outputs. The resulting product values may be output to the logical-sum matrix 48.

The logical-sum matrix 48 may selectively generate sums (e.g., "OR" functions in Boolean logic.) The logical-sum matrix 48 may also be a square matrix, or the logical-sum matrix 48 may have a different number of inputs than outputs. Since the inputs are logical products, the outputs of the logical-sum matrix 48 may be logical-Sums-of-Products (e.g., Boolean logic Sum-of-Product (SOP) form). The output of the logical-sum matrix 48 may be received by the initialization-routing matrix 50.

The initialization-routing matrix 50 may reset portions of the detection array 34 and the aggregation module 24 via the aggregation-routing matrix 42. The initialization-routing matrix 50 may also be implemented as a square matrix, or the initialization-routing matrix 50 may have a different number of inputs than outputs. The initialization-routing matrix 50 may respond to signals from the logical-sum matrix 48 and re-initialize other portions of the pattern-recognition processor 14, such as when a search criterion is satisfied or determined to be not further satisfiable.

The aggregation module 24 may include an output buffer 51 that receives the outputs of the threshold-logic matrix 44, the aggregation-routing matrix 42, and the logical-sum matrix 48. The output of the aggregation module 24 may be transmitted from the output buffer 51 to the CPU 20 (FIG. 1) on the output bus 26. In some embodiments, an output multiplexer may multiplex signals from these components 42, 44, and 48 and output signals indicative of satisfaction of criteria or matches of search terms to the CPU 20 (FIG. 1). In other embodiments, results from the pattern-recognition processor 14 may be reported without transmitting the signals through the output multiplexer, which is not to suggest that any other feature described herein could not also be omitted. For example, signals from the threshold-logic matrix 44, the logical-product matrix 46, the logical-sum matrix 48, or the initialization routing matrix 50 may be transmitted to the CPU in parallel on the output bus 26.

Figure 3:
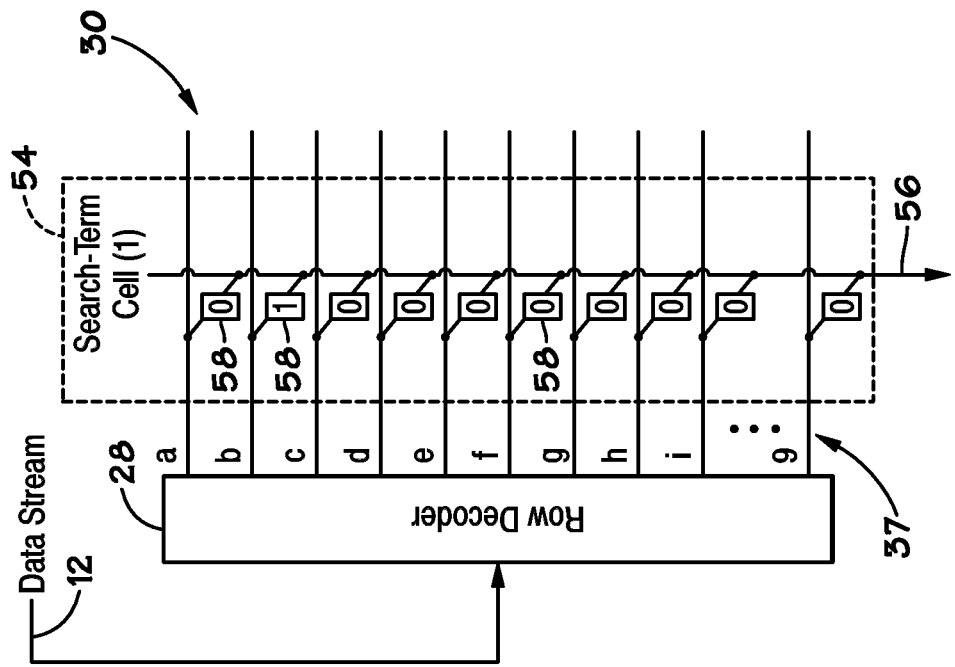
FIG. 3 depicts an example of a search-term cell in the pattern-recognition processor of FIG. 2.

FIG. 3 illustrates a portion of a single feature cell 30 in the search-term array 32 (FIG. 2), a component referred to herein as a search-term cell 54. The search-term cells 54 may include an output conductor 56 and a plurality of memory cells 58. Each of the memory cells 58 may be coupled to both the output conductor 56 and one of the conductors among the plurality of input conductors 37. In response to its input conductor 37 being selected, each of the memory cells 58 may output a value indicative of its stored value, outputting the data through the output conductor 56. In some embodiments, the plurality of input conductors 37 may be referred to as "word lines", and the output conductor 56 may be referred to as a "data line".

The memory cells 58 may include any of a variety of types of memory cells. For example, the memory cells 58 may be volatile memory, such as dynamic random access memory (DRAM) cells having a transistor and a capacitor. The source and the drain of the transistor may be connected to a plate of the capacitor and the output conductor 56, respectively, and the gate of the transistor may be connected to one of the input conductors 37. In another example of volatile memory, each of the memory cells 58 may include a static random access memory (SRAM) cell. The SRAM cell may have an output that is selectively coupled to the output conductor 56 by an access transistor controlled by one of the input conductors 37. The memory cells 58 may also include nonvolatile memory, such as phase-change memory (e.g., an ovonic device), flash memory, silicon-oxide-nitride-oxide-silicon (SONOS)

memory, magneto-resistive memory, or other types of non-volatile memory. The memory cells 58 may also include flip-flops, e.g., memory cells made out of logic gates.

FIGS. 4 and 5 depict an example of the search-term cell 54 in operation. FIG. 4 illustrates the search-term cell 54 receiving a term that does not match the cell's search term, and FIG. 5 illustrates a match.

As illustrated by FIG. 4, the search-term cell 54 may be configured to search for one or more terms by storing data in the memory cells 58. The memory cells 58 may each represent a term that the data stream 12 might present, e.g., in FIG. 3, each memory cell 58 represents a single letter or number, starting with the letter "a" and ending with the number "9". Memory cells 58 representing terms that satisfy the search term may be programmed to store a first value, and memory cells 58 that do not represent terms that satisfy the search term may be programmed to store a different value. In the illustrated example, the search-term cell 54 is configured to search for the letter "b". The memory cells 58 that represent "b" may store a 1, or logic high, and the memory cells 58 that do not represent "b" may be programmed to store a 0, or logic low.

To compare a term from the data stream 12 with the search term, the row decoder 28 may select the input conductor 37 coupled to memory cells 58 representing the received term. In FIG. 4, the data stream 12 presents a lowercase "e". This term may be presented by the data stream 12 in the form of an eight-bit ASCII code, and the row decoder 28 may interpret this byte as a row address, outputting a signal on the conductor 60 by energizing it.

In response, the memory cell 58 controlled by the conductor 60 may output a signal indicative of the data that the memory cell 58 stores, and the signal may be conveyed by the output conductor 56. In this case, because the letter "e" is not one of the terms specified by the search-term cell 54, it does not match the search term, and the search-term cell 54 outputs a 0 value, indicating no match was found.

In FIG. 5, the data stream 12 presents a character "b". Again, the row decoder 28 may interpret this term as an address, and the row decoder 28 may select the conductor 62. In response, the memory cell 58 representing the letter "b" outputs its stored value, which in this case is a 1, indicating a match.

The search-term cells 54 may be configured to search for more than one term at a time. Multiple memory cells 58 may be programmed to store a 1, specifying a search term that matches with more than one term. For instance, the memory cells 58 representing the letters lowercase "a" and uppercase "A" may be programmed to store a 1, and the search-term cell 54 may search for either term. In another example, the search-term cell 54 may be configured to output a match if any character is received. All of the memory cells 58 may be programmed to store a 1, such that the search-term cell 54 may function as a wildcard term in a search criterion.

Figure 6:
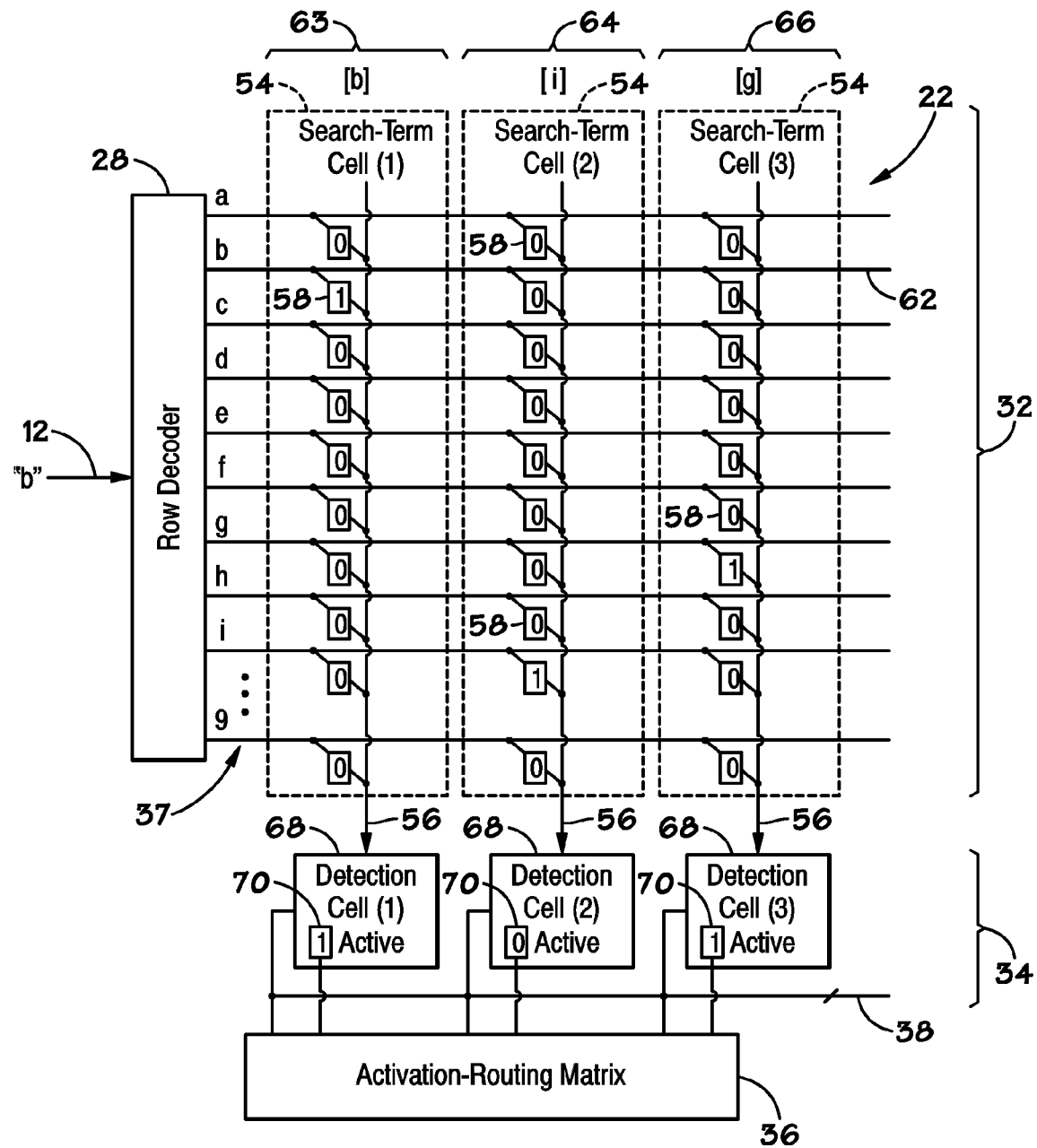
FIGS. 6-8 depict a recognition module including several search-term cells searching the data stream for a word.
Figure 7:
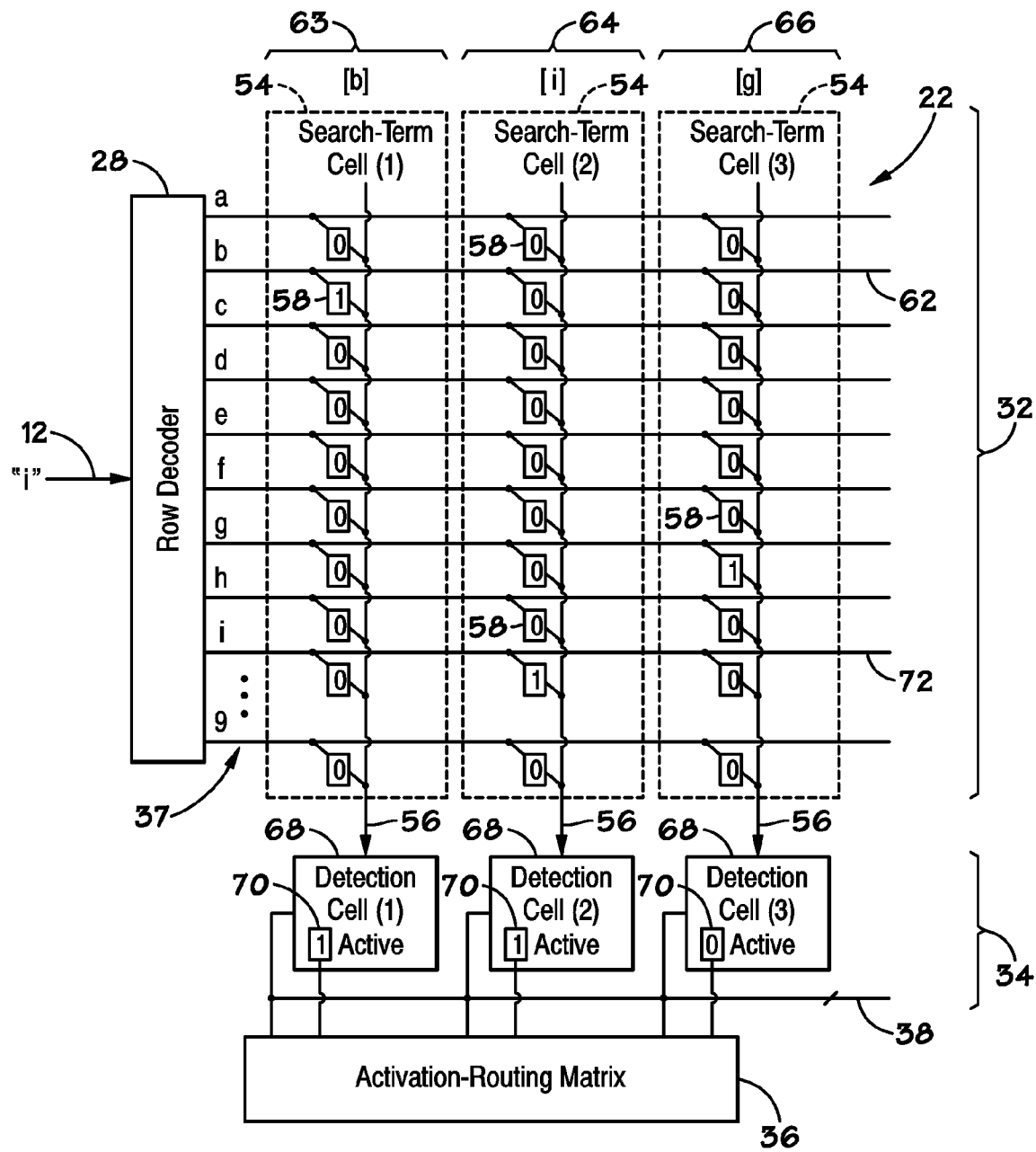
Figure 8:
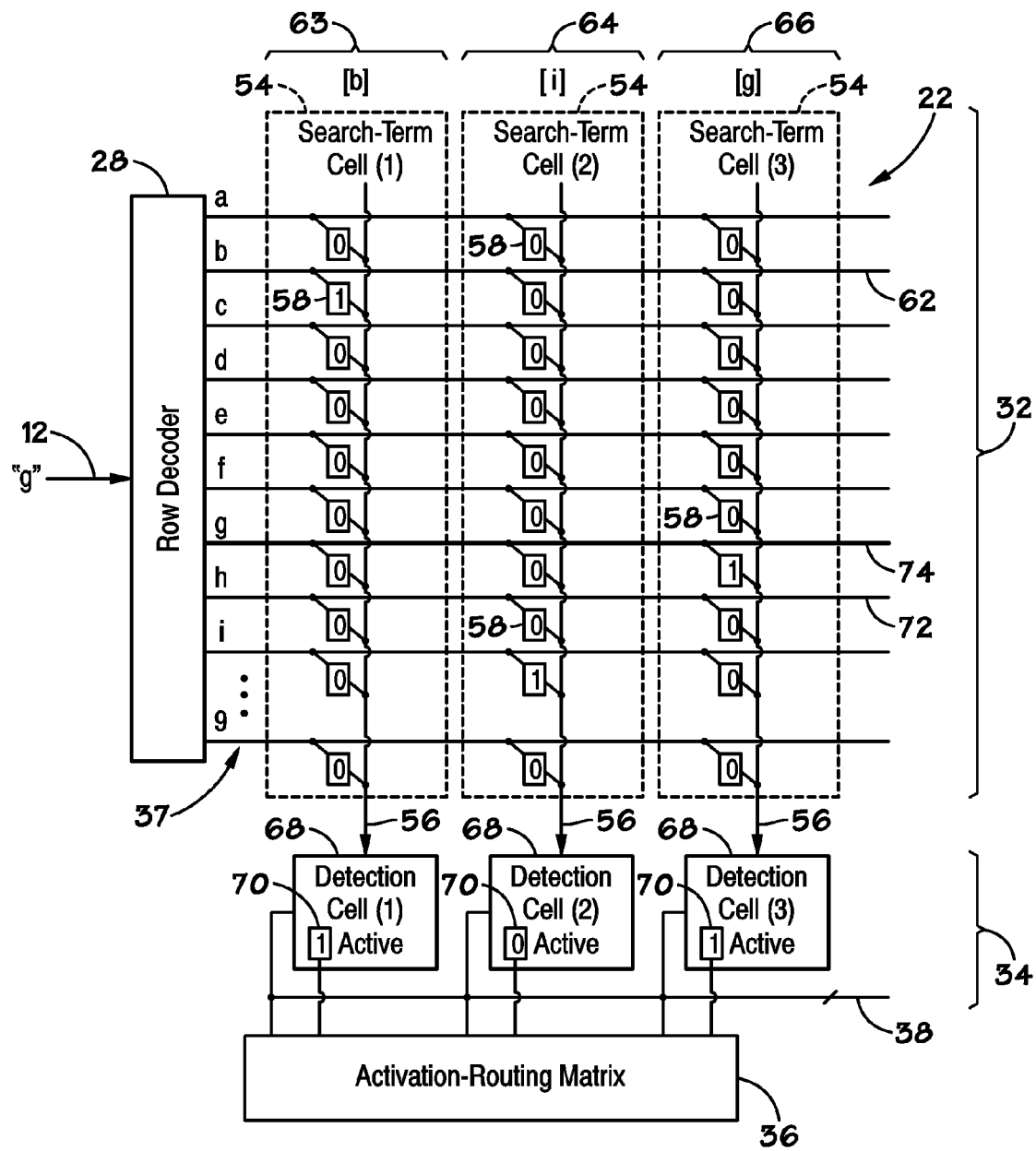

FIGS. 6-8 depict the recognition module 22 searching according to a multi-term search criterion, e.g., for a word. Specifically, FIG. 6 illustrates the recognition module 22 detecting the first letter of a word, FIG. 7 illustrates detection of the second letter, and FIG. 8 illustrates detection of the last letter.

As illustrated by FIG. 6, the recognition module 22 may be configured to search for the word "big". Three adjacent feature cells 63, 64, and 66 are illustrated. The feature cell 63 is configured to detect the letter "b". The feature cell 64 is configured to detect the letter "i". The feature cell 66 is configured to both detect the letter "g" and indicate that the search criterion is satisfied.

FIG. 6 also depicts additional details of the detection array 34. The detection array 34 may include a detection cell 68 in each of the feature cells 63, 64, and 66. Each of the detection cells 68 may include a memory cell 70, such as one of the types of memory cells described above (e.g., a flip-flop), that indicates whether the feature cell 63, 64, or 66 is active or inactive. The detection cells 68 may be configured to output a signal to the activation-routing matrix 36 indicating whether the detection cells 68 are active and has received a signal from its associated search-term cell 54 indicating a match. Inactive features cells 63, 64, and 66 may disregard matches. Each of the detection cells 68 may include an AND gate with inputs from the memory cell 70 and the output conductor 56. The output of the AND gate may be routed to both the detection bus 38 and the activation-routing matrix 36, or one or the other.

The activation-routing matrix 36, in turn, may selectively activate the feature cells 63, 64, and 66 by writing to the memory cells 70 in the detection array 34. The activation-routing matrix 36 may activate feature cells 63, 64, or 66 according to the search criterion and which search term is being searched for next in the data stream 12.

In FIG. 6, the data stream 12 presents the letter "b". In response, each of the feature cells 63, 64, and 66 may output a signal on their output conductor 56, indicating the value stored in the memory cell 58 connected to the conductor 62, which represents the letter "b". The detection cells 56 may then each determine whether they have received a signal indicating a match and whether they are active. Because the feature cell 63 is configured to detect the letter "b" and is active, as indicated by its memory cell 70, the detection cell 68 in the feature cell 63 may output a signal to the activation-routing matrix 36 indicating that the first search term of the search criterion has been matched.

As illustrated by FIG. 7, after the first search term is matched, the activation-routing matrix 36 may activate the next feature cell 64 by writing a 1 to its memory cell 70 in its detection cell 68. The activation-routing matrix 36 may also maintain the active state of the feature cell 63, in case the next term satisfies the first search term, e.g., if the sequence of terms "bbig" is received. The first search term of search criteria may be maintained in an active state during a portion or substantially all of the time during which the data stream 12 is searched.

In FIG. 7, the data stream 12 presents the letter "i" to the recognition module 22. In response, each of the feature cells 63, 64, and 66 may output a signal on their output conductor 56, indicating the value stored in the memory cell 58 connected to the conductor 72, which represents the letter "i". The detection cells 56 may then each determine whether they have received a signal indicating a match and whether they are active. Because the feature cell 64 is configured to detect the letter "i" and is active, as indicated by its memory cell 70, the detection cell 68 in the feature cell 64 may output a signal to the activation-routing matrix 36 indicating that the next search term of its search criterion has been matched.

Next, the activation-routing matrix 36 may activate the feature cell 66, as illustrated by FIG. 8. Before evaluating the next term, the feature cell 64 may be deactivated. The feature cell 64 may be deactivated by its detection cell 68 resetting its memory cell 70 between detection cycles or the activation-routing matrix 36 may deactivate the feature cell 64, for example.

In FIG. 8, the data stream 12 presents the term "g" to the row decoder 28, which selects the conductor 74 representing the term "g". In response, each of the feature cells 63, 64, and 66 may output a signal on their output conductor 56, indicating the value stored in the memory cell 58 connected to the conductor 74, which represents the letter "g". The detection cells 68 may then each determine whether they have received a signal indicating a match and whether they are active. Because the feature cell 66 is configured to detect the letter "g" and is active, as indicated by its memory cell 70, the detection cell 68 in the feature cell 66 may output a signal to the activation routing matrix 36 indicating that the last search term of its search criterion has been matched.

The end of a search criterion or a portion of a search criterion may be identified by the activation-routing matrix 36 or the detection cell 68. These components 36 or 68 may include memory indicating whether their feature cell 63, 64, or 66 specifies the last search term of a search criterion or a component of a search criterion. For example, a search criterion may specify all sentences in which the word "cattle" occurs twice, and the recognition module may output a signal indicating each occurrence of "cattle" within a sentence to the aggregation module, which may count the occurrences to determine whether the search criterion is satisfied.

Feature cells 63, 64, or 66 may be activated under several conditions. A feature cell 63, 64, or 66 may be "always active", meaning that it remains active during all or substantially all of a search. An example of an always active feature cell 63, 64, or 66 is the first feature cell of the search criterion, e.g., feature cell 63.

A feature cell 63, 64, or 66 may be "active when requested", meaning that the feature cell 63, 64, or 66 is active when some condition precedent is matched, e.g., when the preceding search terms in a search criterion are matched. An example is the feature cell 64, which is active when requested by the feature cell 63 in FIGS. 6-8, and the feature cell 66, which is active when requested by the feature cell 64.

A feature cell 63, 64, or 66 may be "self activated", meaning that once it is activated, it activates itself as long as its search term is matched. For example, a self activated feature cell having a search term that is matched by any numerical digit may remain active through the sequence "123456xy" until the letter "x" is reached. Each time the search term of the self activated feature cell is matched, it may activate the next feature cell in the search criterion. Thus, an always active feature cell may be formed from a self activating feature cell and an active when requested feature cell. The self activating feature cell may be programmed with all of its memory cells 58 storing a 1, and it may repeatedly activate the active when requested feature cell after each term. In some embodiments, each feature cell 63, 64, and 66 may include a memory cell in its detection cell 68 or in the activation-routing matrix 36 that specifies whether the feature cell is always active, thereby forming an always active feature cell from a single feature cell.

Figure 9:
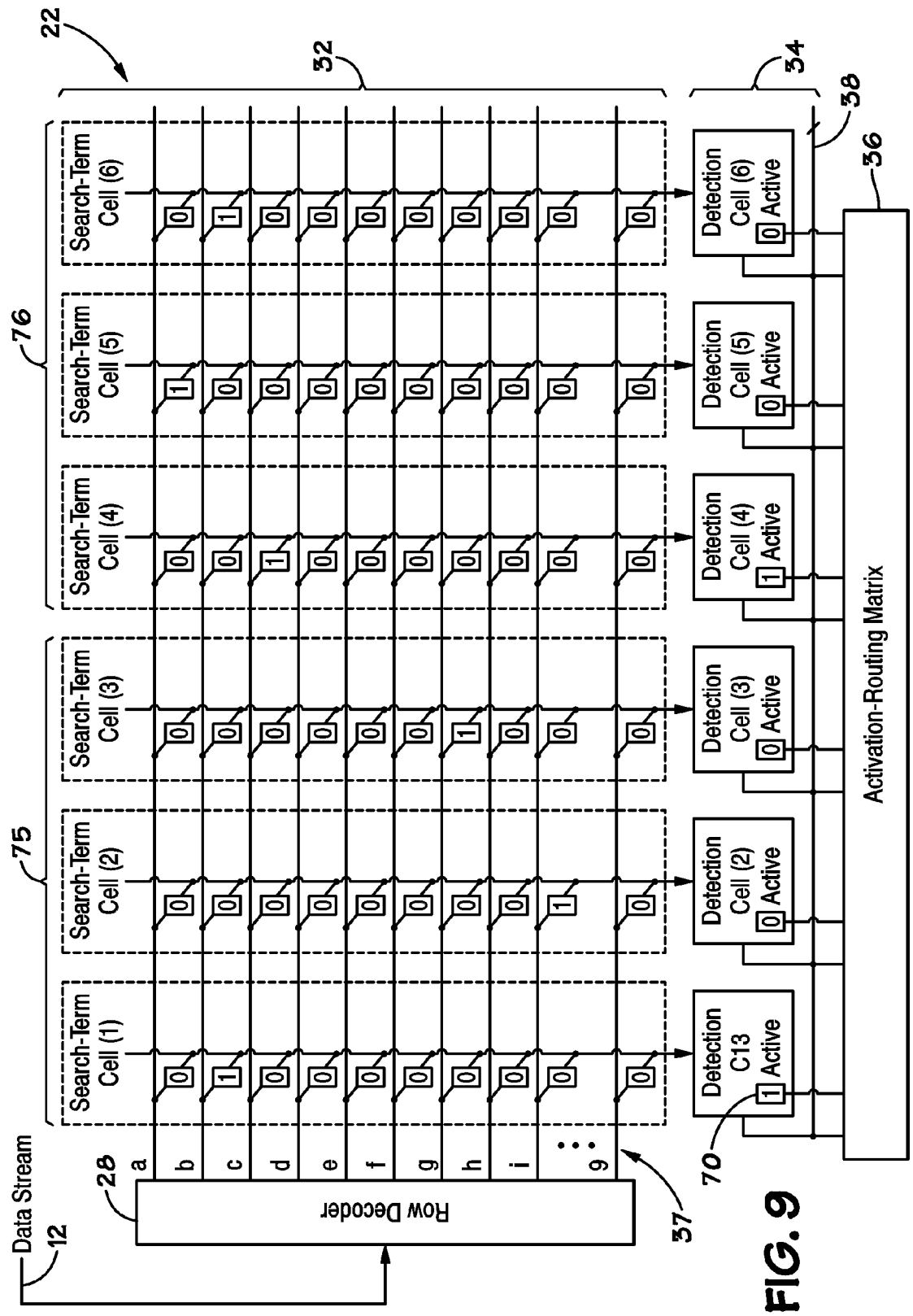
FIG. 9 depicts the recognition module configured to search the data stream for two words in parallel.

FIG. 9 depicts an example of a recognition module 22 configured to search according to a first search criterion 75 and a second search criterion 76 in parallel. In this example, the first search criterion 75 specifies the word "big", and the second search criterion 76 specifies the word "cab". A signal indicative of the current term from the data stream 12 may be communicated to feature cells in each search criterion 75 and 76 at generally the same time. Each of the input conductors 37 spans both of the search criteria 75 and 76. As a result, in some embodiments, both of the search criteria 75 and 76 may evaluate the current term generally simultaneously. This is believed to speed the evaluation of search criteria. Other embodiments may include more feature cells configured to evaluate more search criteria in parallel. For example, some embodiments may include more than 100, 500, 1000, 5000, or 10,000 feature cells operating in parallel. These feature cells may evaluate hundreds or thousands of search criteria generally simultaneously.

Search criteria with different numbers of search terms may be formed by allocating more or fewer feature cells to the search criteria. Simple search criteria may consume fewer resources in the form of feature cells than complex search criteria. This is believed to reduce the cost of the pattern-recognition processor 14 (FIG. 2) relative to processors with a large number of generally identical cores, all configured to evaluate complex search criteria.

Figure 10:
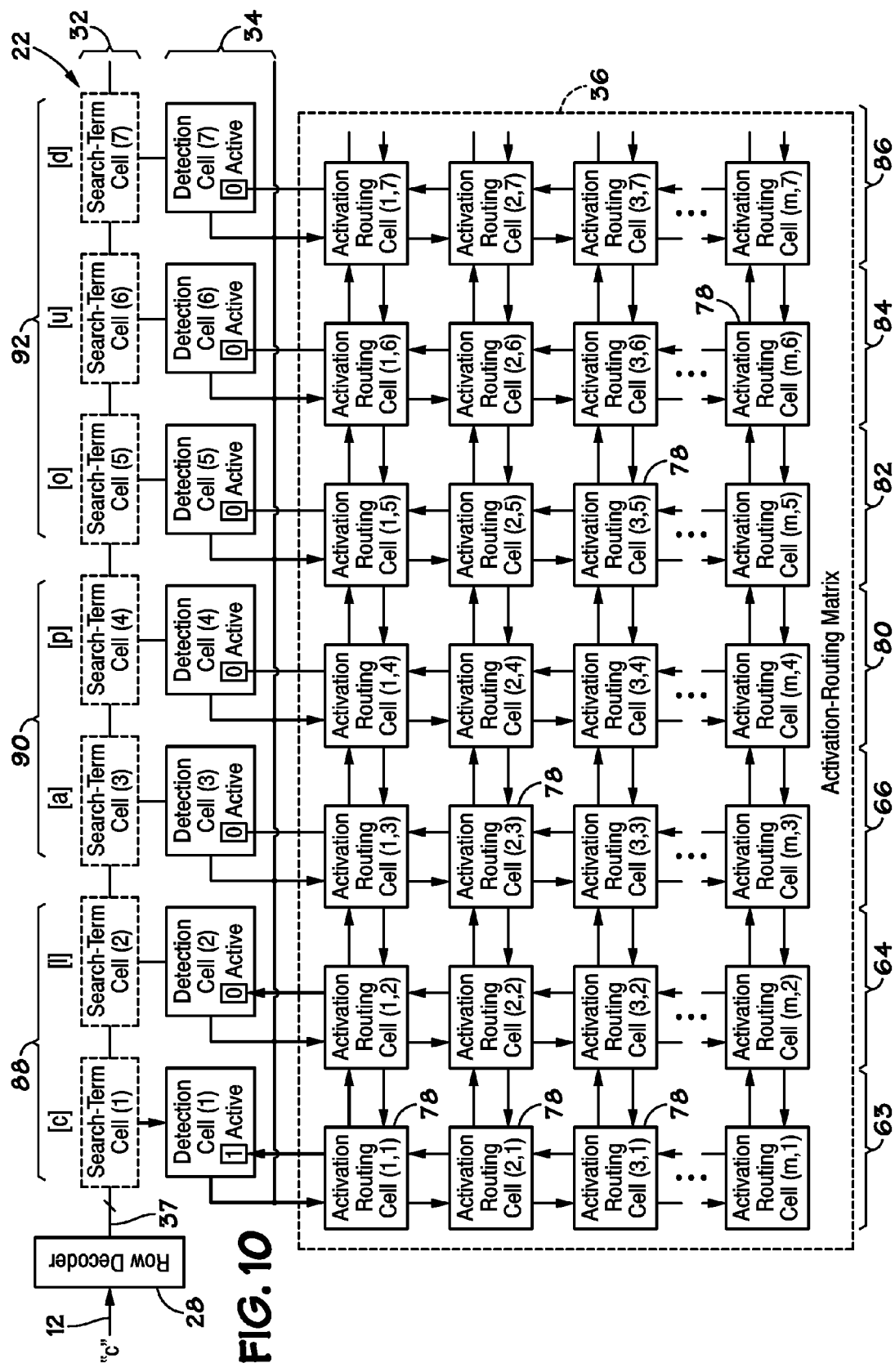
FIGS. 10-12 depict the recognition module searching according to a search criterion that specifies multiple words with the same prefix.
Figure 11:
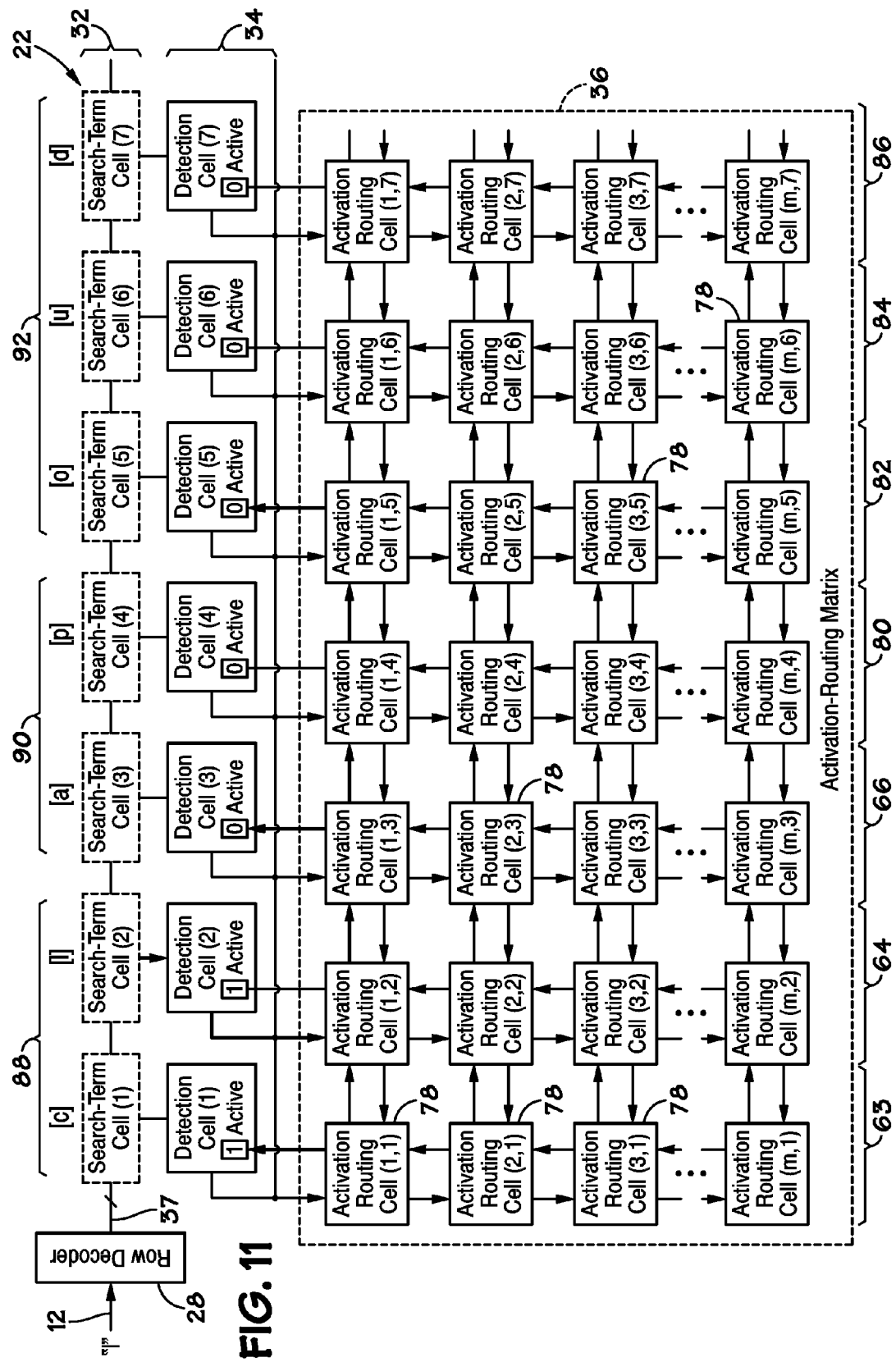
Figure 12:
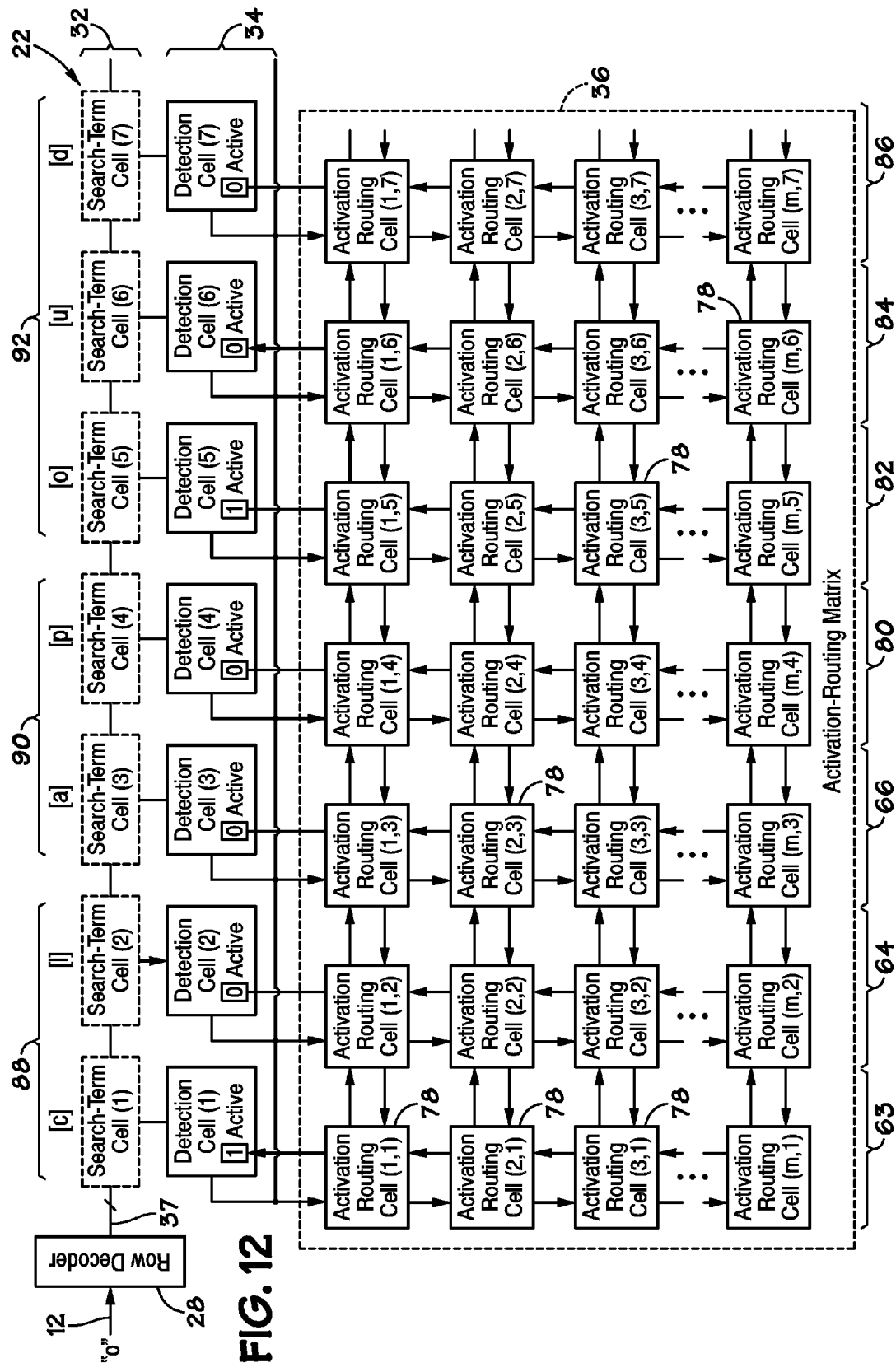

FIGS. 10-12 depict both an example of a more complex search criterion and features of the activation-routing matrix 36. The activation-routing matrix 36 may include a plurality of activation-routing cells 78, groups of which may be associated with each of the feature cells 63, 64, 66, 80, 82, 84, and 86. For instance, each of the feature cells may include 5, 10, 20, 50, or more activation-routing cells 78. The activation-routing cells 78 may be configured to transmit activation signals to the next search term in a search criterion when a preceding search term is matched. The activation-routing cells 78 may be configured to route activation signals to adjacent feature cells or other activation-routing cells 78 within the same feature cell. The activation-routing cells 78 may include memory that indicates which feature cells correspond to the next search term in a search criterion.

As illustrated by FIGS. 10-12, the recognition module 22 may be configured to search according to complex search criteria than criteria that specify single words. For instance, the recognition module 22 may be configured to search for words beginning with a prefix 88 and ending with one of two suffixes 90 or 92. The illustrated search criterion specifies words beginning with the letters "c" and "l" in sequence and ending with either the sequence of letters "ap" or the sequence of letters "oud". This is an example of a search criterion specifying multiple target expressions, e.g., the word "clap" or the word "cloud".

In FIG. 10, the data stream 12 presents the letter "c" to the recognition module 22, and feature cell 63 is both active and detects a match. In response, the activation-routing matrix 36 may activate the next feature cell 64. The activation-routing matrix 36 may also maintain the active state of the feature cell 63, as the feature cell 63 is the first search term in the search criterion.

In FIG. 11, the data stream 12 presents a letter "l", and the feature cell 64 recognizes a match and is active. In response, the activation-routing matrix 36 may transmit an activation signal both to the first feature cell 66 of the first suffix 90 and to the first feature cell 82 of the second suffix 92. In other examples, more suffixes may be activated, or multiple prefixes may active one or more suffixes.

Next, as illustrated by FIG. 12, the data stream 12 presents the letter "o" to the recognition module 22, and the feature cell 82 of the second suffix 92 detects a match and is active. In response, the activation-routing matrix 36 may activate the next feature cell 84 of the second suffix 92. The search for the first suffix 90 may die out, as the feature cell 66 is allowed to go inactive. The steps illustrated by FIGS. 10-12 may continue through the letters "u" and "d", or the search may die out until the next time the prefix 88 is matched.

Figure 13:
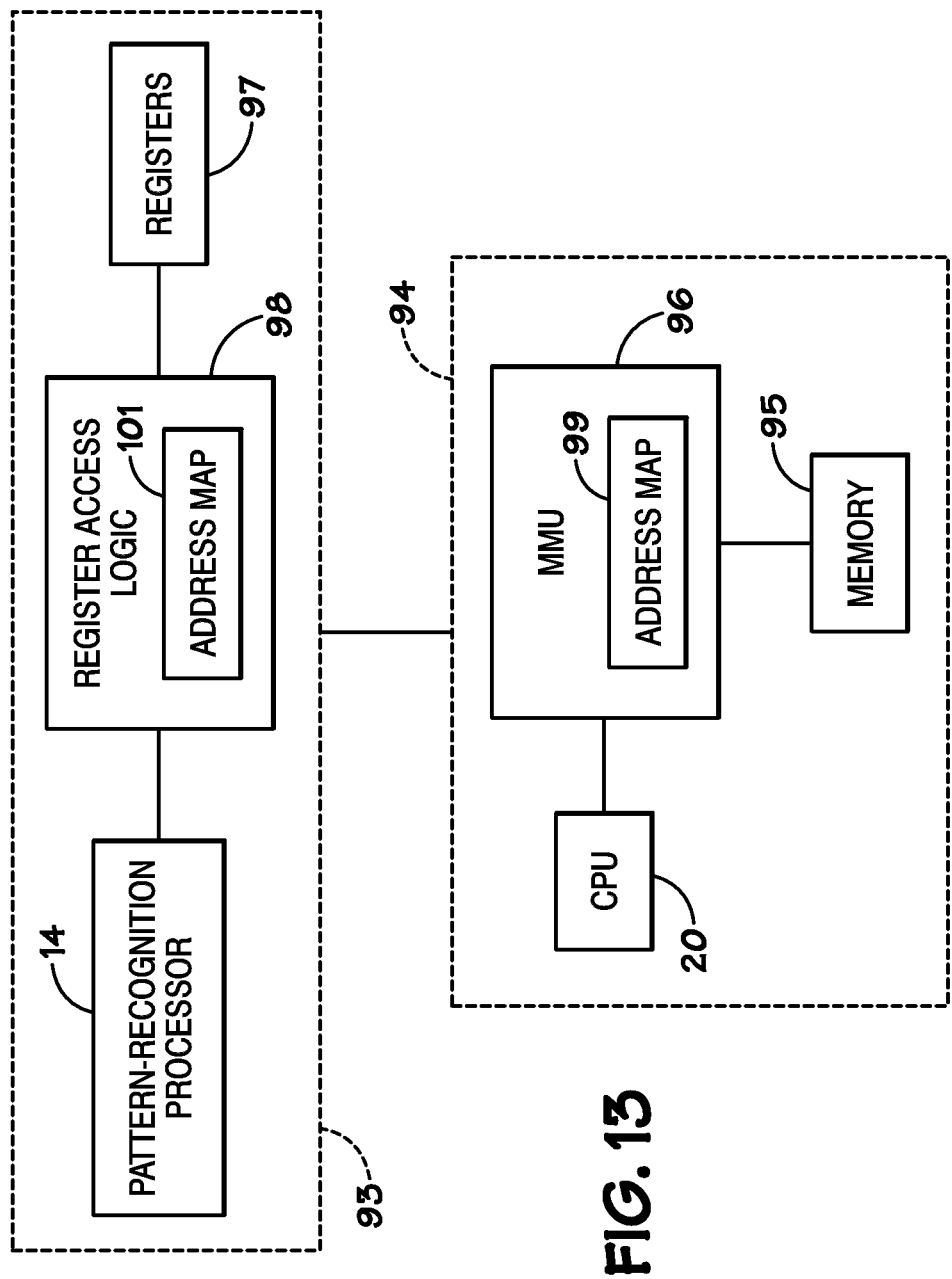
FIG. 13 depicts the pattern recognition processor of FIG. 2 having accessible registers in accordance with an embodiment of the present invention.

In some embodiments, such as that illustrated in FIG. 13, the pattern-recognition processor 14 may be part of a device 93 accessed by a controller or some other device or system, such as a host computer system 94. The computer system 94 may include, for example, a processor, such as a central processing unit (CPU) 20, that accesses a memory 95 via a memory management unit (MMU) 96. The memory 95 may include any suitable memory device, including, but not limited to, static random access memory (SRAM), dynamic random access memory (DRAM), or a generation of Double Data Rate (DDR) memory (e.g., DDR1, DDR2, DDR3, or DDR4). Further, the MMU 96 may be provided in a separate hardware component of the system 94, such as a northbridge of a motherboard chipset, or may be integrated into the CPU 20. Although device 93 is presently illustrated as separate from the computer system 94, it will be appreciated that some or all of the components of the device 93 and the computer system 94, including, but not limited to, those explicitly illustrated in FIG. 13 and discussed herein, may be integrated into a single device.

As described further below, in some embodiments the pattern-recognition processor 14, or the device 94 having the pattern-recognition processor 14, may include a plurality of registers 97 to store information related to the pattern-recognition system described above. To facilitate reading and writing data to and from the registers 97, register access logic 98 may manage the access to the registers 97. The register access logic 98 may be implemented in hardware, or in any other suitable manner. In various embodiments, the registers 97 and/or register access logic 98 may be a part of the pattern recognition processor 14, or may be separate from but accessible by the pattern recognition processor 14.

The plurality of registers 97 may include registers that store matching results, counts, configuration information, control information and status, debug information, etc. Any desirable information related to the pattern recognition process described above may be stored in the registers 97. The large quantity of data that may be stored in the registers 97 may result in a relatively large number of registers.

The MMU 96 may use an address map 99, which includes physical memory addresses directly accessible by the CPU 20, to facilitate direct access by the CPU 20 to various memory locations, such as within the memory 95 and the registers 97. The address map 99, however, may have a finite number of addresses that can be mapped to physical memory locations of the system 94 and other devices, such as device 93. For instance, in some embodiments, the system 94 may include a 32-bit address bus that allows $2^{32}$ distinct addresses to be mapped to physical memory locations in the address map 99. In such an embodiment, and given an address space of a fixed size, the number of addresses that may be mapped to physical locations in the memory 95 is inversely related to the number of addresses mapped to physical locations outside the memory 95, such as in the registers 97. For instance, if each address is mapped to a one-byte physical memory location, $2^{32}$ available addresses could be mapped to, and allow direct access by the CPU 20 of, 4 GB of memory. If a substantial number of addresses within the address map 99 were allocated to the registers 97, fewer addresses would be available for mapping to the memory 95, which may reduce the amount of memory 95 accessible to the CPU 20 and result in decreased performance of the system 94. In some embodiments, address space of the system 94 and the address map 99 may be conserved through the indirect addressing techniques discussed below.

In accordance with certain embodiments of the present invention, a majority of the registers 97 may be indirectly accessible by the system 94 (and not included within the address space of the system 94 or address map 99), while a specific subset of registers 97 may be directly accessible by, and included within the memory space of, the system 94. These two types of registers may be referred to as "indirect registers" and "direct registers," respectively. That is, in order to preserve memory address space of a processing system, such as the system 94, a large number of registers may be logically and/or physically located such that they are not directly accessible by the processing unit. These registers may be of any desired size, such as 8-bit registers, 16-bit registers, 32-bit registers, 36-bit registers, 64-bit registers, or the like.

In one embodiment, the device 93 includes a separate address map 101 that may be used to facilitate access to physical locations of the registers 97, and that generally provides a map to the indirect registers not included in the address map 99 of the system 94. As discussed further below, the direct registers also allow access to the indirect registers, and can be used to funnel all requests for access to the indirect registers through the easily accessed direct registers. The direct registers allow rapid access by the system 94 (e.g., by the CPU 20), yet restriction of the direct registers to a subset of the registers 97 reduces the amount of memory address space within system 94 used for the registers 97. Additionally, in some embodiments, various techniques may speed up accesses to the indirect registers, reducing any system slowdowns caused by accessing these indirect registers. While the indirect addressing technique disclosed herein may be employed in conjunction with a pattern-recognition processor in some embodiments, such indirect addressing may also be used in other embodiments that do not include such a pattern-recognition processor.

Figure 14:
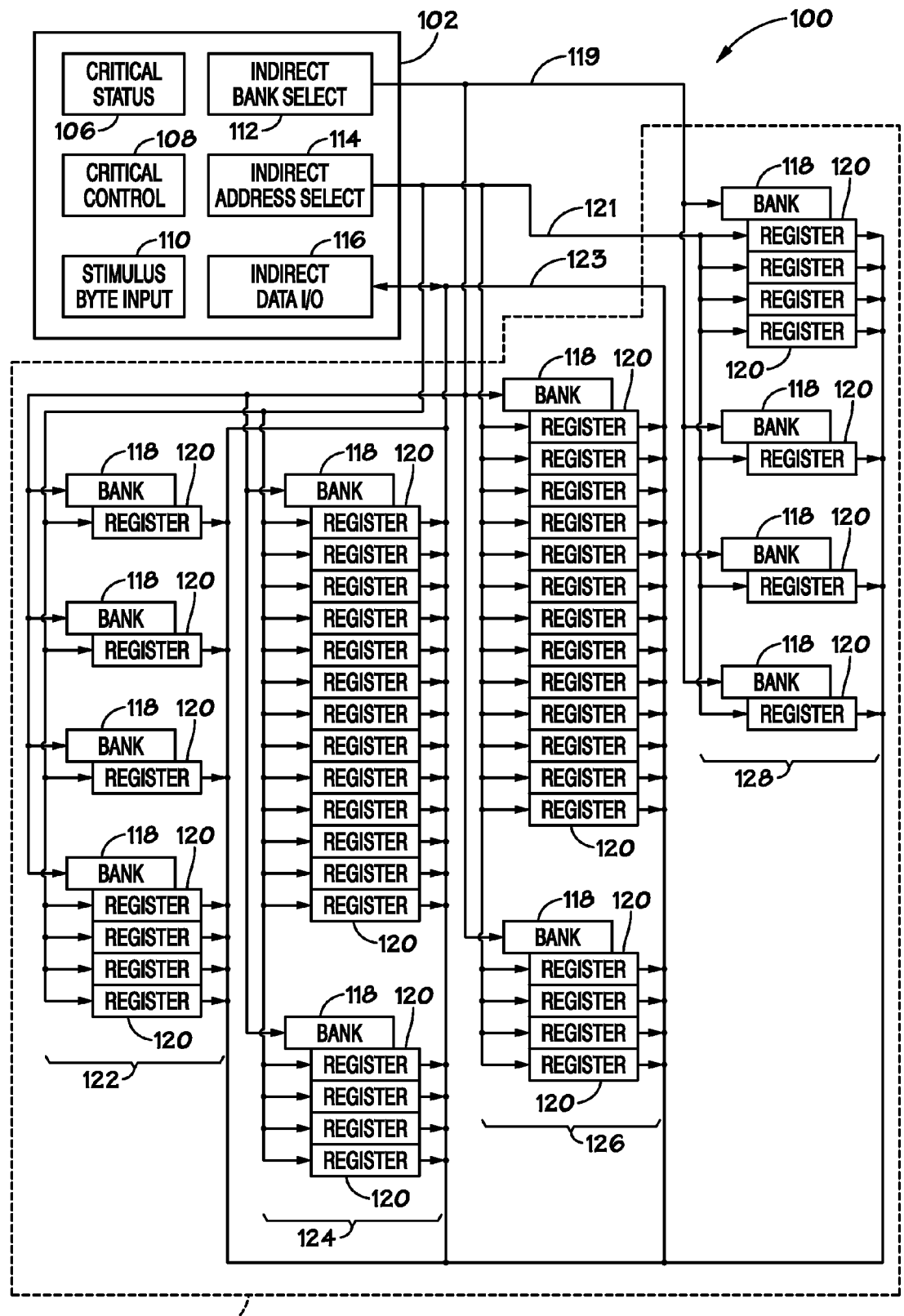
FIG. 14 illustrates a system having direct and indirect registers of the pattern recognition processor of FIG. 2 in accordance with an embodiment of the present invention.

FIG. 14 illustrates a system 100 having direct and indirect registers of the pattern recognition processor 14 in accordance with an embodiment of the present invention. The system 100 includes a direct register set (or group) 102 (also referred to as a "base register set"), and an indirect register set (or group) 104. The base register set 102 may include any number of "critical" registers, that is, those registers where direct accessibility by the system 94 (or some other controller, system, or device) is most desired. In the embodiment illustrated in FIG. 14, the base register set 102 includes six registers, although in other embodiments any number of registers may be used in the base register set 102. Further, it should be appreciated that selection of the "critical" registers used in the base register set 102 is configurable based on the pattern recognition processor 14 and the system. Thus, in other embodiments, some of the registers of the base register set 102 in FIG. 14 may be omitted and other registers may be included in the base register set 102.

In the illustrated embodiment, the base register set 102 includes the following registers: a critical status register 106; a critical control register 108; a stimulus byte input register 110, an indirect bank select register 112; an indirect address select register 114; and an indirect data in/out register 116. In one embodiment, each register of the base register set 102 may be a 32-bit register, and may be accessible over a 32-bit address bus. Further, the registers of the register set 102 may be read/write registers, allowing both reads and writes. As described further below, the indirect bank select register 112, the indirect address select register 114, and the indirect data in/out register 116 aid in accessing the indirect registers 104. These three registers 112, 114, and 116 may collectively be referred to as the "indirect addressing access registers."

The critical status register 106, the critical control register 108, and the stimulus byte input register 110 provide access to functions and information that may be quickly accessed by the system 94 or some other controller, preventing the access delay associated with providing these functions and information via the indirect registers 104. The critical control register 108 provides critical control bits during the pattern matching operation when speed of processing is critical. For example, such bits may include stop/run, reset, DMA start/stop, mode selection, etc. Any other critical control bits may be used in the critical control register 108.

The critical status register 106 provides critical status information during the pattern matching operation. The status information bits stored in the register 106 may be "sticky" bits (updated only when explicitly requested), may be "auto-updated," or may never be updated. Examples of status bits stored in the register 106 may include endian-mode, endianness selection, DMA mode, DMA status, status of matches, detection of matches, etc.

The stimulus-byte input register 110 provides storage of the data to be searched from the data stream 12. Storing the data in the stimulus-byte input register 110 allows parallel functions to occur, speeding up operation of the pattern recognition processor 14. For example, data from the data stream 12 can be processed at the same time as reading of indirect "match results" bank registers.

The indirect register set 104 may include any number of register banks 118 comprising one or more registers 120. Various types of indirect register groups are described below. However, it should be appreciated that the groups described are merely exemplary and any other registers, register groups, and/or register banks may be included. The indirect register set 104 may include a flow save and restore group 122, a match result and debug group 124, a power-on configuration group 126, and a pattern configuration group 128. The flow save and restore group 122 may include status indicators and counter values, such as threshold counters, processed byte counters, etc. The match results and debug group 124 may include group logic outputs, recognition array outputs, and any other results and outputs. The power-on configuration group 126 includes registers identifying and configuring the pattern recognition processor 14, such as device capabilities, manufacturer identification codes, system parameters, etc. Finally, the pattern configuration group 128 includes functions and information used with the pattern recognition process, such as recognition array state, aggregation functions, etc.

In some embodiments, accessing an indirect register may require three or more bus cycles, such as selecting a register bank, selecting an indirect register within the bank, and then writing or receiving data to or from the indirect register. In accordance with an embodiment of the present invention, however, the indirect addressing access registers 112, 114, and 116 provide a system for decreasing access time to the indirect register set 104. The indirect bank select register 112 selects the bank 118 of the indirect register set 104 to be accessed. Each of the various banks 118 may be selected by a specific address value, as indicated by a bank select bus line 119. In one embodiment, the indirect bank select register 112 may be a 32-bit register. As described in more detail below, some bits of the indirect bank select register 112 may be used to select the "auto-change address mode" for the selected register bank. Additionally, writing to the indirect bank select register 112 may automatically set the indirect address select register 114 to a predetermined value. In one embodiment, such writing may automatically reset the indirect address select register 114 to zero (e.g., 0x00000000h for a 32-bit register).

The indirect address select register 114 sets the specific register 120 to be accessed within the bank of registers selected by the indirect bank register select 112, as indicated by register address bus 121. In each selected bank, the registers start at a zero address. In some embodiments, because the indirect address select register 114 is set to zero after writing to the indirect bank select register 112, the indirect address select register 114 may be written with the desired address after the indirect bank select register 112 is written. As described further below, the indirect address select register 114 is capable of "auto-increment," "auto-decrement," "auto-reset," and "no change" modes (referred to as "auto-change address modes") that increase performance when doing successive reads or writes to consecutive register addresses.

The indirect data in/out register 116 provides the write or read functionality for the indirect register set 104, as indicated by the register data in/out bus 123. Writing to the indirect data in/out register 116 writes data into the register at the address specified by the indirect bank select register 112 and the indirect address select register 114. Reading from the indirect data in/out register 116 reads the register at the address specified by the combination of the indirect bank select register 112 and the indirect address select register 114. Thus, by using the indirect bank select register 112, the indirect address select register 114, and the indirect data in/out register 116, data may be written to or read from the indirect registers 104.

Because accessing each of the indirect registers 104 requires accessing the registers 112, 114, and 116, access to the indirect registers 104 may be appreciably slower than accessing the direct registers 102. As mentioned above, to speed up access to the banks of the indirect register set 104, the pattern recognition processor 14 and the register logic 96 may utilize one or more auto-change address modes. In one embodiment, the auto-change address mode may be set via one or more bits of the indirect bank select register 112. These bits may be referred to as "auto change address bits." In other embodiments, any register may be used to set and store the auto change address bits.

The auto-change address modes may include various modes to speed up access to consecutive registers of the banks 118 of the indirect registers 104, or may include modes to quickly reset the indirect address select register 114. In one embodiment, these modes may include an "auto-increment" mode, an "auto-decrement" mode, and an "auto-reset" mode. Additionally, a "no-change" mode may be selected.

In the auto-increment mode, the currently accessed register address specified by the indirect address select register 114 is incremented at the completion of the current indirect data in/out register bus cycle. Similarly, in the auto-decrement mode, the currently accessed register address specified by the indirect address select register 114 is decremented at the completion of the current indirect data in/out register bus cycle. If the auto-reset mode is selected, the indirect address select register 114 is set to a predetermined value (e.g., zero in an "auto-reset-to-zero" mode) at the completion of the current cycle. If the no change mode is selected, no change is made to the currently selected register address specified by the indirect address select register 114 at the completion of the current cycle. The auto-change address modes for the embodiment described above are summarized in Table 1.

TABLE 1

Summary of auto-change address modes

| Auto-Change Selection | Address for Current Access | Address for Next Access |
|---|---|---|
| None | <address> | <address> |
| Auto-Increment | <address> | <address> + 1 |
| Auto-Decrement | <address> | <address> − 1 |
| Auto-Reset-to-Zero | <address> | 0x00000000h |

It should be appreciated that various embodiments may include any one or more of the auto-change address modes described above. In other embodiments, any other auto-change address modes that modify a currently accessed register address may be implemented, including logical operators (such as AND, OR, XOR, and the like), HASH functions, etc.

Figure 15C:
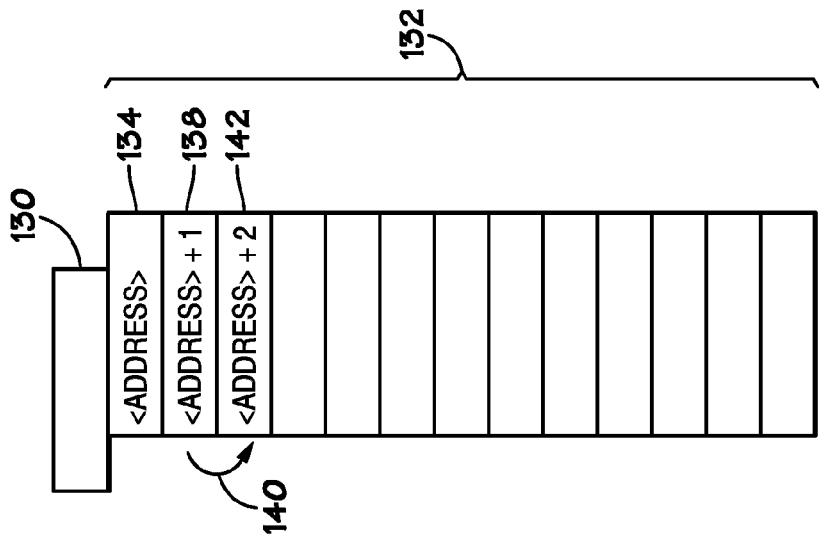
FIGS. 15A-15C illustrate operation of an auto-increment mode of an auto-change address mode in accordance with an embodiment of the present invention.
Figure 15B:
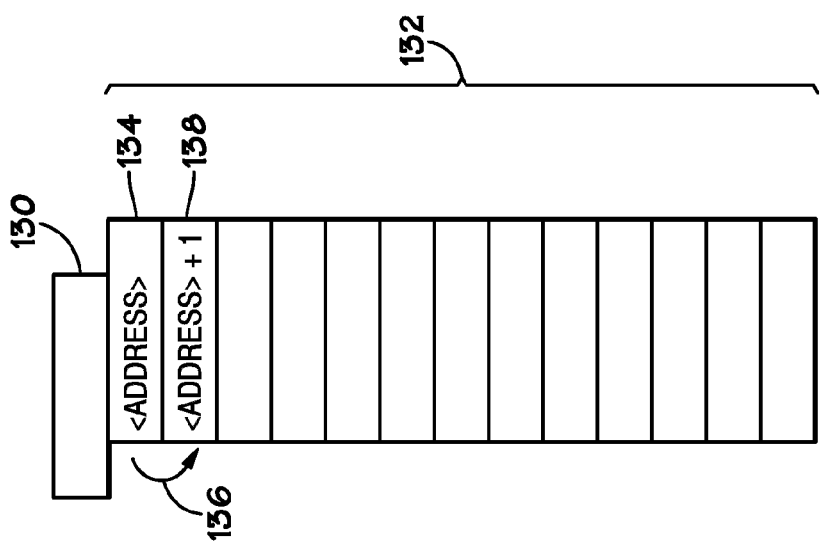
Figure 15A:
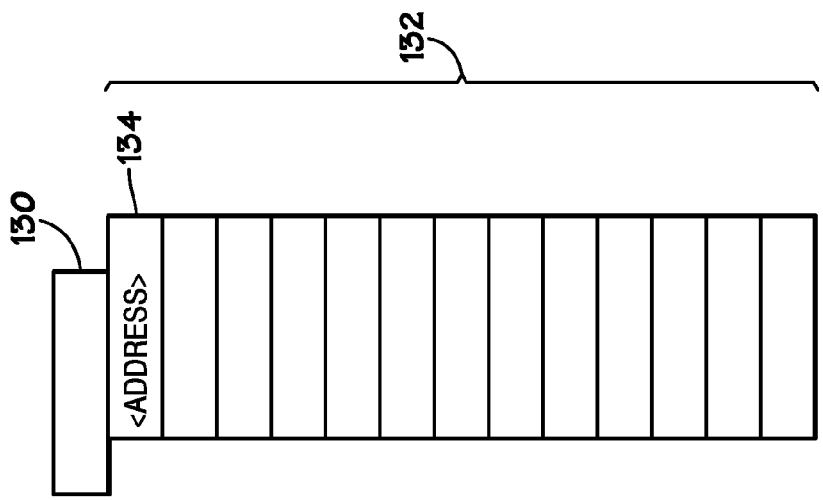

FIGS. 15A-C illustrate operation of the auto-increment mode of the auto-change address modes described above in accordance with an embodiment of the present invention. FIGS. 15A-C depict a register bank 130 having a plurality of registers 132, such as may be included in the indirect register set 104. As described above, writing to the indirect bank select register 112 sets the address of the desired register bank 130, the auto-change address bits that indicate the auto-change address mode, and resets the indirect address select register 114 to a predetermined address, such as zero. Thus, to setup indirect access to the bank 130 and registers 132, only one write cycle is needed, as opposed to separate write cycles, to first write to the indirect bank select register 112, determine the auto change address mode, and then select the indirect address register 114 as zero, for example.

After writing to the indirect bank select register 112 to select the bank 130, data may be written to or read from the indirect data in/out register 116 if the indirect register address <0> is the desired indirect register of the selected bank 130. If a different indirect register needs to be accessed, then the indirect address select register 114 is written to with the desired register address to select a specific register. For example, as shown in FIG. 15A, a first register 134 of the bank 130 having a address of "<address>" may be selected through the indirect bank select register 112 and the indirect address select register 114. After selecting the register 134, data may be written to or read from the indirect data in/out register 116.

In auto-increment mode, the current register address "<address>" set in the indirect address select register 114 automatically increments after writing the first register 134, as illustrated by arrow 136 in FIG. 15B. The next write cycle writes to a second register 138 having a register address of "<address>+1." Thus, the next register 138 is written without having to rewrite to the indirect bank select register 112 or the indirect address select register 114. Similarly, the next write cycle, as illustrated in FIG. 15C, increments the currently selected address "<address>+1" by one, as illustrated by arrow 140. The next write writes to a third register 142 having a register address of "<address>+2." The writing cycles continue writing to incremented register addresses until the end of the bank 130. The auto-increment mode allows bursts of accesses to successive registers 134, 138, 142, and so on, increasing the speed of writing or reading large banks of indirect registers.

Figure 16A:
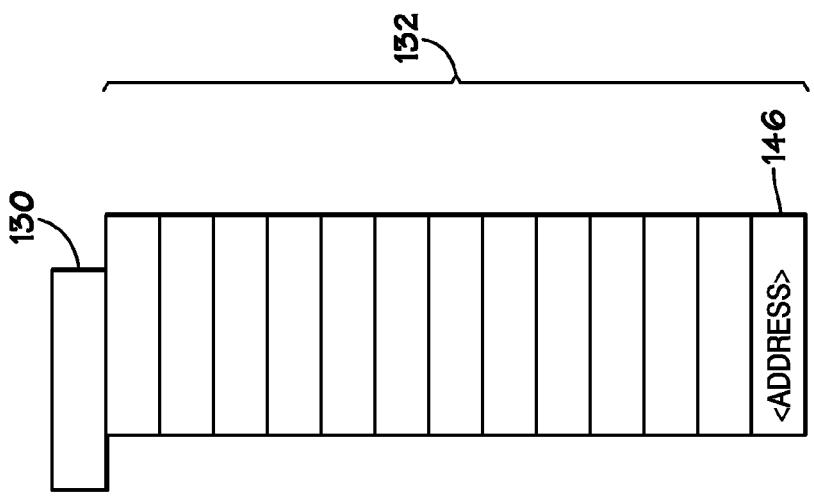
FIGS. 16A-16C illustrate operation of an auto-decrement mode of an auto-change address mode in accordance with an embodiment of the present invention.
Figure 16B:
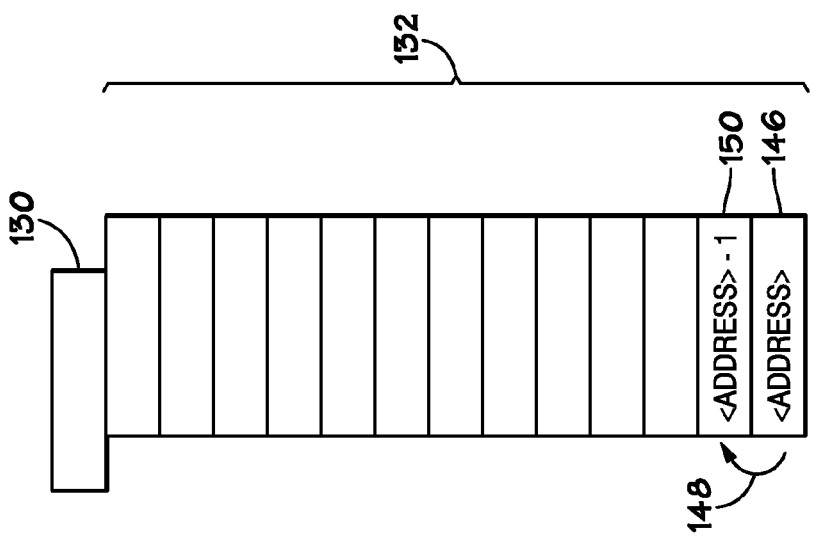
Figure 16C:
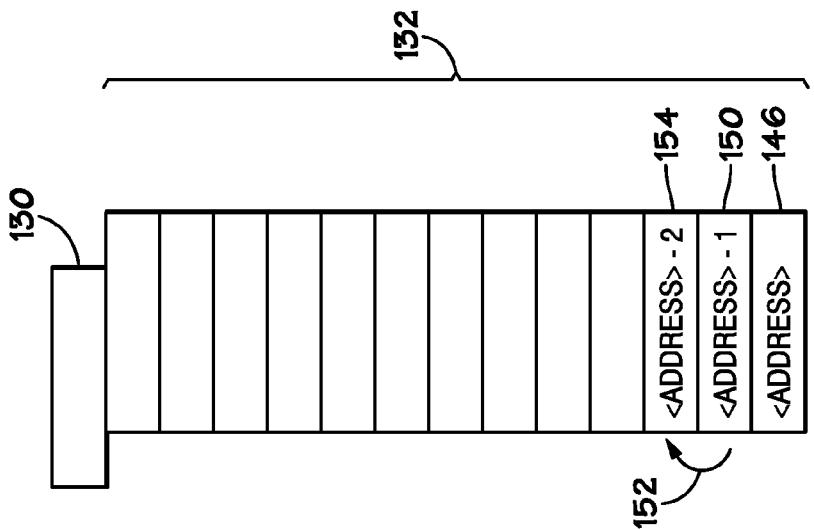

FIGS. 16A-C illustrate operation of the auto-decrement mode of the auto-change address modes on the bank 130 and bank registers 132 in accordance with an embodiment of the present invention. As described above, writing to the indirect bank select register 112 sets the register bank 130 to be written, the auto-decrement mode via the auto-change address bits, and resets the indirect address select register 114 to zero (or some other predetermined value). After the indirect b a n k select address 112 is set, the indirect address select register 114 is set to select a specific register, such as the register 146 having an address of "<address>." For example, as shown in FIG. 16A, a first register 146 of the bank 130 may be written by writing to the indirect data in/out register 116. In auto-decrement mode, the current register address "<address>" automatically decrements by one address value after writing the first register 146, as illustrated by arrow 148 in FIG. 16B. The next write cycle writes to a second register 150 having a register address of "<address>-1." After this write cycle, the currently selected register address "<address>-1" is decremented by one address value, as indicated by arrow 152 in FIG. 15C. The next write cycle writes to a third register 154 having a register address of "<address>-2." Successive write cycles continually decrement the currently selected indirect register address until the end of the bank 130. As with the auto-increment mode, the auto-decrement mode provides for reading or writing data to registers 132 in bursts of accesses to successive registers 146, 150, 154, and so on, increasing the speed of writing or reading large banks of registers.

The additional auto-change address modes referred to above, auto-reset mode and no change, may be used when no increment or decrement functionality is desired. For example, the no-change mode may be used if the currently accessed register is a status, interrupt, or other function having only one register in a bank, such that no burst read or writes are desired. An "auto-reset-to-zero" mode may be used when the indirect register address <0> is frequently read or written, but another indirect register is occasionally read or written.

Figure 17:
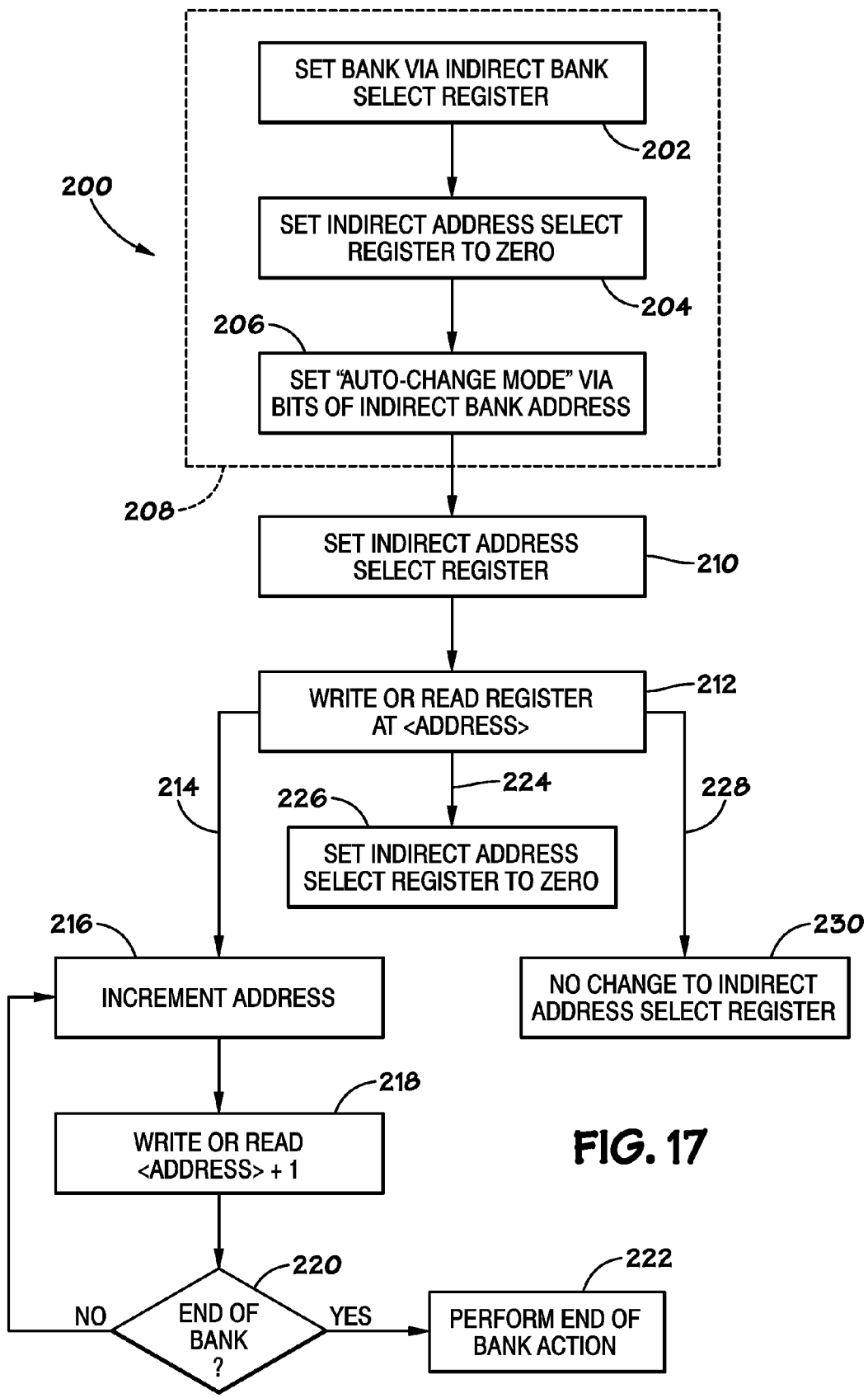
FIG. 17 depicts a process for writing to or reading from indirect registers of a pattern recognition processor in accordance with an embodiment of the present invention.

FIG. 17 depicts a process 200 for writing to or reading from the indirect registers 104 in accordance with an embodiment of the present invention. A write or read operation begins by writing the desired bank address to the indirect bank select register 112 (block 202). In the present embodiment, writing the indirect bank select register 112 sets the indirect address select register 114 to zero, e.g., 0x00000000h for a 32-bit register (block 204). The auto-change address mode is set by the dedicated auto-change address mode bits written to the indirect bank address register 112 (block 206). As illustrated in the FIG. 17, the blocks 202, 204, and 206 occur in one write cycle, as indicated by dashed area 208. That is, the write to the indirect bank select register 112 results in automatic execution of the blocks 204 and 206 of the process 200.

The specific register address to be written, referred to as "<address>," is written to the indirect address select register 114 (block 210). Data is written to or read from the register at "<address>," depending on the requested operation, via the indirect data in/out register 116 (block 212).

The auto-change address mode received from the indirect bank select register 112 then determines if the currently accessed register address <address> is modified. If the auto-change address mode is auto-increment mode, as indicated by arrow 214, the "<address>" of the current register address increments by one (block 216). The next successive register in the selected bank is written or read (block 218). If the end of the bank has not been reached (decision block 220), the process 200 may continue to increment the current address at block 216 until the end of the bank. It should be appreciated that the auto-decrement mode functions similarly, except the current register address "<address>" decrements by one in block 216. In one embodiment, various further actions may be taken (block 222) if the end of the bank has been reached. By way of example, in one embodiment, further writing to the selected register bank may be prevented and an error condition may be indicated if another write is attempted. In other embodiments, the current address may be reset to the first address (in auto-increment mode) or last address (in auto-decrement mode) of the selected bank, the selected bank in the indirect bank select register 112 may be incremented or decremented (depending on the current auto-change mode), some other action may be taken, or some combination of these actions may be performed. For instance, in an auto-increment mode, once the end of a bank is reached, the indirect bank select register value may be incremented, and the indirect address select register value may be set to zero or some other value.

Alternatively, if the auto-change address mode is the return-to-zero mode as indicated by arrow 224, the indirect address select register is reset to zero, e.g., 0x00000000h for a 32-bit register (block 226). If the auto-change address mode is no-change, as indicated by arrow 228, then no change is made to the indirect address select register (block 230), e.g., the indirect address select register remains set at the current register address "<address>."

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
    a processor;
    a pattern-recognition processor; and
    a plurality of registers, wherein the plurality of registers includes a first set of registers directly accessible by the processor via a first address map and a second set of registers not directly accessible by the processor via the first address map, wherein the first set and the second set of registers are directly accessible by the pattern-recognition processor via a second address map, and wherein the system is configured such that the second set of registers is indirectly accessible by the processor via the first set of registers.

2. The system of claim 1, comprising a device including the plurality of registers.

3. The system of claim 2, wherein the device includes the processor.

4. The system of claim 2, wherein the processor is external to the device.

5. The system of claim 2, comprising a computer system, wherein the processor is a central processing unit of the computer system.

6. The system of claim 5, wherein the device is external to the computer system.

7. The system of claim 5, wherein the computer system includes a memory management unit configured to facilitate memory access by the processor via the first address map.

8. The system of claim 7, wherein the first address map includes physical addresses for the first set of registers and does not include physical addresses for the second set of registers.

9. The system of claim 8, wherein the device includes register access logic configured to facilitate accessing, via the second address map, of one or more registers of the second set of registers based on data stored in at least one register of the first set of registers.

10. The system of claim 2, wherein the device includes a pattern-recognition device.

* * * * *